(12) United States Patent
Lee et al.

(10) Patent No.: US 8,446,237 B1
(45) Date of Patent: May 21, 2013

(54) MEMS RELAY AND METHOD OF FORMING THE MEMS RELAY

(71) Applicant: National Semiconductor Corporation, Santa Clara, CA (US)

(72) Inventors: Dok Won Lee, Mountain View, CA (US); Peter Johnson, Sunnyvale, CA (US); Aditi Dutt Chaudhuri, Mountain View, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 13/739,587

(22) Filed: Jan. 11, 2013

Related U.S. Application Data

(62) Division of application No. 13/020,052, filed on Feb. 3, 2011, now Pat. No. 8,378,766.

(51) Int. Cl.
*H01H 51/22* (2006.01)

(52) U.S. Cl.
USPC .......................................................... 335/78

(58) Field of Classification Search
USPC ............................................................ 335/78
See application file for complete search history.

(56) References Cited

U.S. PATENT DOCUMENTS

| | | | |
|---|---|---|---|
| 6,094,116 A * | 7/2000 | Tai et al. | 335/78 |
| 6,492,887 B1 * | 12/2002 | Diem et al. | 335/78 |
| 6,859,122 B2 * | 2/2005 | Divoux et al. | 335/78 |
| 7,042,319 B2 * | 5/2006 | Ishiwata et al. | 335/78 |
| 7,064,637 B2 * | 6/2006 | Tactic-Lucic et al. | 335/78 |
| 7,902,946 B2 | 3/2011 | Niblock | |
| 2002/0050881 A1 * | 5/2002 | Hyman et al. | 335/78 |
| 2002/0196112 A1 * | 12/2002 | Ruan et al. | 335/78 |
| 2003/0179056 A1 * | 9/2003 | Wheeler et al. | 335/78 |
| 2003/0179057 A1 * | 9/2003 | Shen et al. | 335/78 |
| 2003/0222740 A1 * | 12/2003 | Ruan et al. | 335/78 |
| 2004/0207498 A1 * | 10/2004 | Hyman et al. | 335/78 |
| 2007/0018761 A1 * | 1/2007 | Yamanaka et al. | 335/78 |
| 2007/0018762 A1 * | 1/2007 | Wheeler et al. | 335/78 |

OTHER PUBLICATIONS

Cho, H.J. et al., "Electroplated thick permanent magnet arrays with controlled direction of magnetization for MEMS application", Journal of Applied Physics, vol. 87, No. 9, 2000, pp. 6340-6342.

* cited by examiner

*Primary Examiner* — Alexander Talpalatski
(74) *Attorney, Agent, or Firm* — Eugene C. Conser; Wade J. Brady, III; Frederick J. Telecky, Jr.

(57) ABSTRACT

A micro-electromechanical systems (MEMS) relay includes a switch with a first contact region and a second contact region that are vertically separated from each other by a gap. The MEMS relay requires a small vertical movement to close the gap and therefore is mechanically robust. In addition, the MEMS relay has a small footprint and, therefore, can be formed on top of small integrated circuits.

8 Claims, 45 Drawing Sheets

MEMS RELAY AND METHOD OF FORMING THE MEMS RELAY

RELATED APPLICATION

This application is a divisional of co-pending application Ser. No. 13/020,052 filed on Feb. 3, 2011, which is the subject of a Notice of Allowance mailed on Dec. 19, 2012. Application Ser. No. 13/020,052 is hereby incorporated by reference herein in its entirety.

FIELD OF THE INVENTION

The present invention relates to MEMS devices and, more particularly, to a MEMS relay and a method of forming the MEMS relay.

DESCRIPTION OF THE RELATED ART

A switch is a well-known device that connects, disconnects, or changes connections between devices. An electrical switch is a switch that provides a low-impedance electrical pathway when the switch is "closed," and a high-impedance electrical pathway when the switch is "opened." A mechanical-electrical switch is a type of switch where the low-impedance electrical pathway is formed by physically bringing two electrical contacts together, and the high-impedance electrical pathway is formed by physically separating the two electrical contacts from each other.

An actuator is a well-known mechanical device that moves or controls a mechanical member to move or control another device. Actuators are commonly used with mechanical-electrical switches to move or control a mechanical member that closes and opens the switch, thereby providing the low-impedance and high-impedance electrical pathways, respectively, in response to the actuator.

A relay is a combination of a switch and an actuator where the mechanical member in the actuator moves in response to electromagnetic changes in the conditions of an electrical circuit. For example, electromagnetic changes due to the presence or absence of a current in a coil can cause the mechanical member in the actuator to close and open the switch.

One approach to implementing actuators and relays is to use micro-electromechanical systems (MEMS) technology. MEMS devices are formed using the same fabrication processes that are used to form conventional semiconductor structures, such as the interconnect structures that provide electrical connectivity to the transistors on a die.

BRIEF DESCRIPTION OF THE DRAWINGS

FIGS. 1A-22A are plan views. FIGS. 1B-22B are cross-sectional views taken along lines 1B-1B through 22B-22B in FIGS. 1A-22A. FIGS. 1C-22C are cross-sectional views taken along lines 1C-1C through 22C-22C in FIGS. 1A-22A. FIGS. 1D-22D are cross-sectional views taken along lines 1D-1D through 22D-22D in FIGS. 1A-22A.

DETAILED DESCRIPTION OF THE INVENTION

Figure 1A:
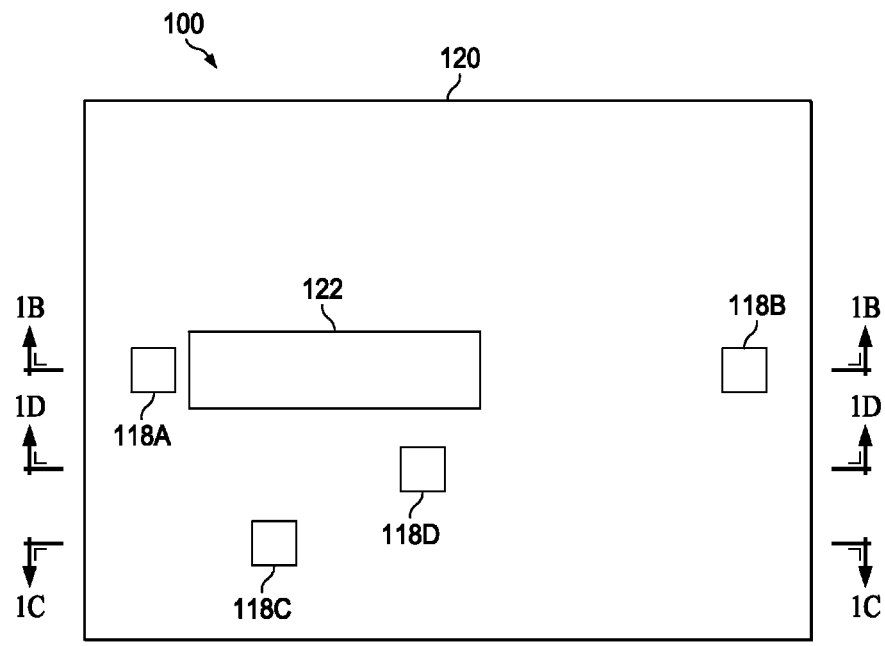
FIGS. 1A-1D through FIGS. 22A-22D are views illustrating an example of a method of forming a MEMS relay in accordance with the present invention.
Figure 1B:
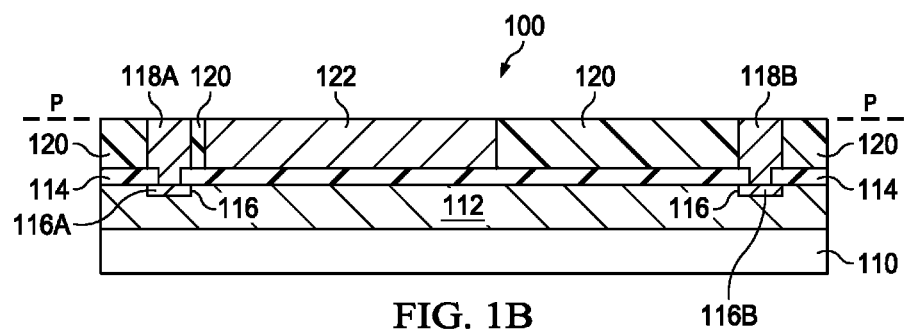
Figure 1C:
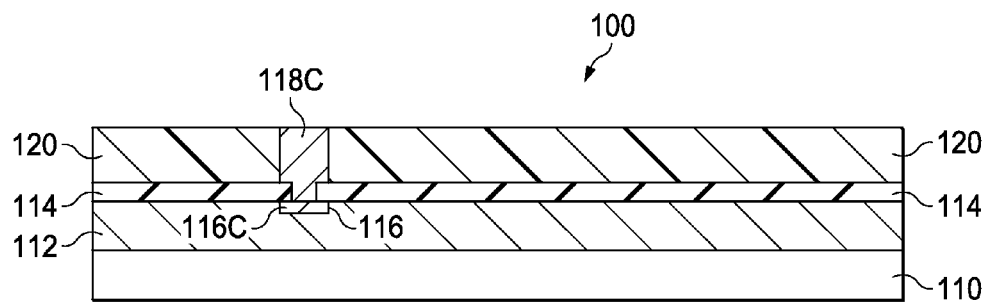
Figure 1D:
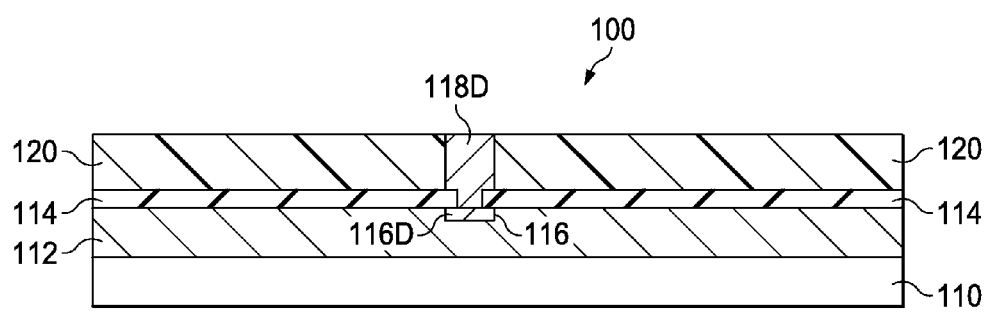
Figure 2A:
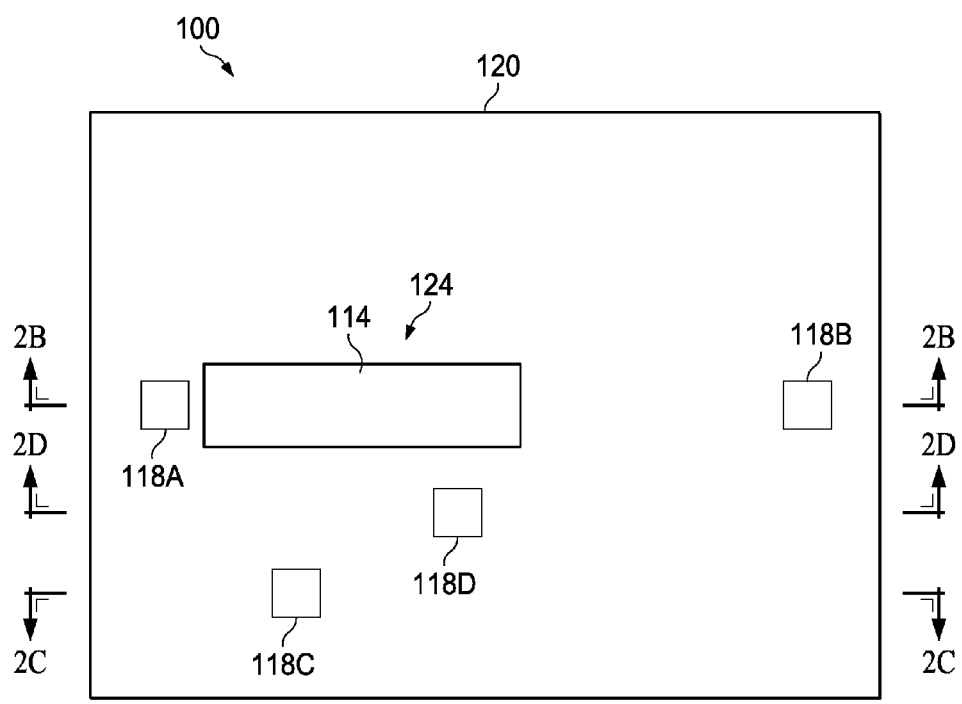
Figure 2B:
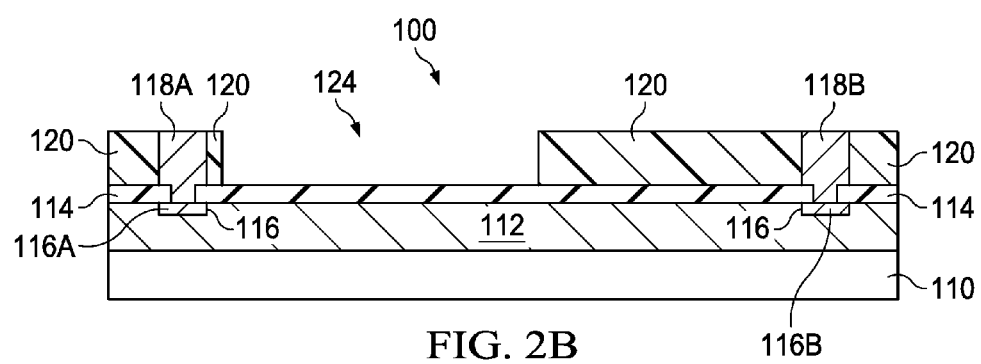
Figure 2C:
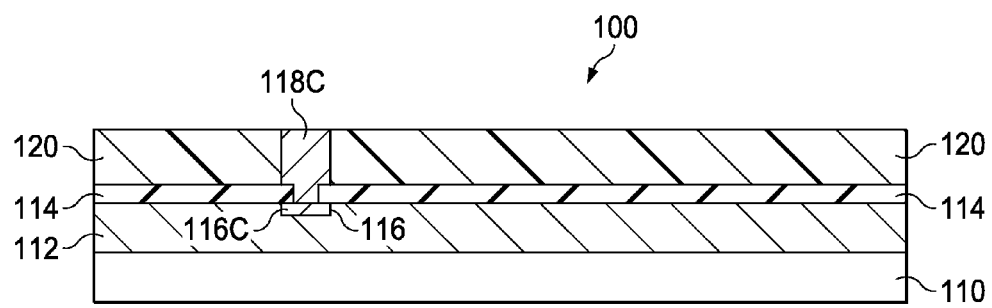
Figure 2D:
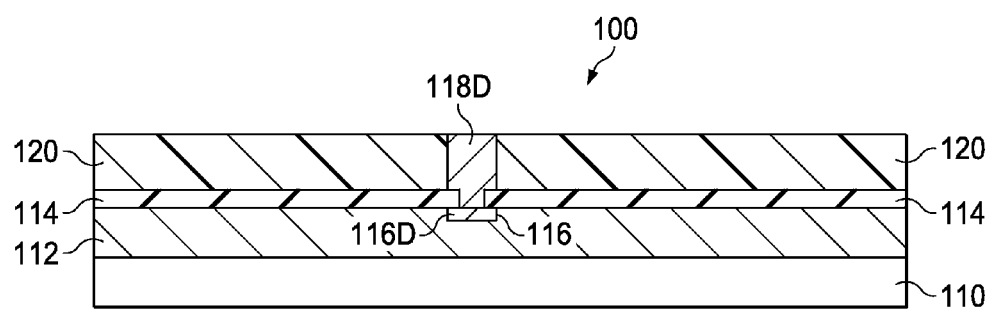
Figure 3A:
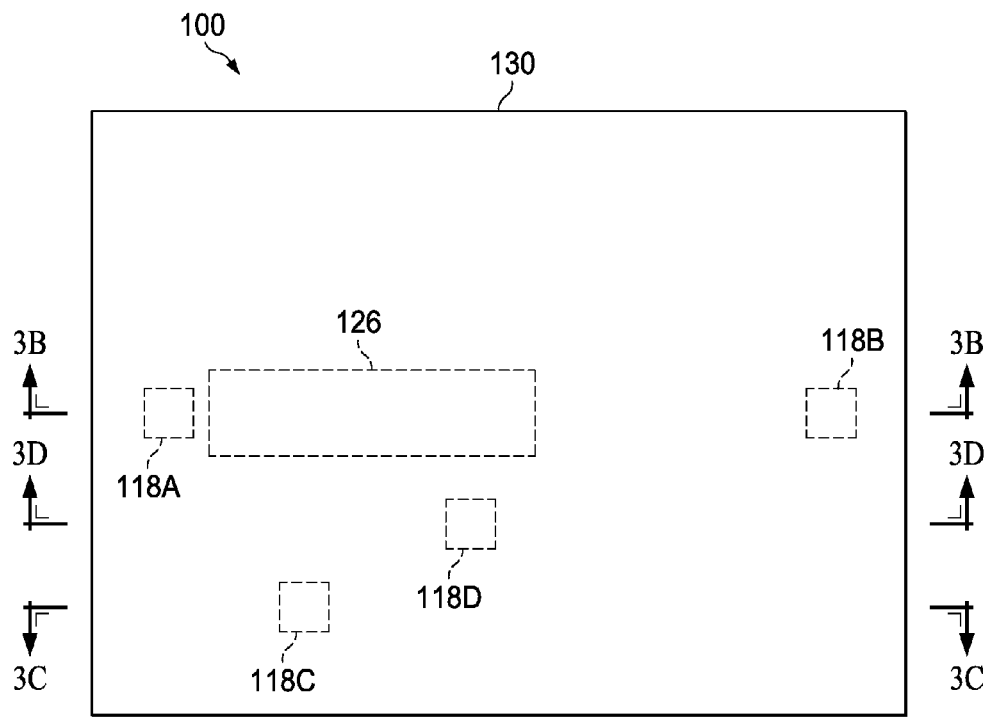
Figure 3B:
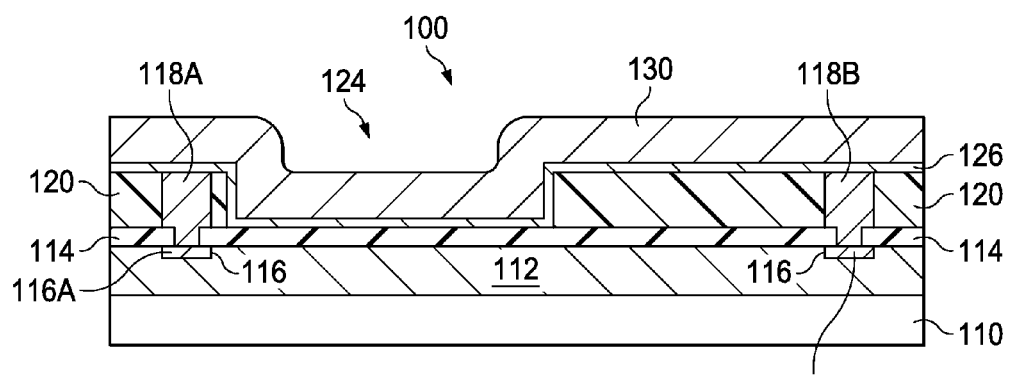
Figure 3C:
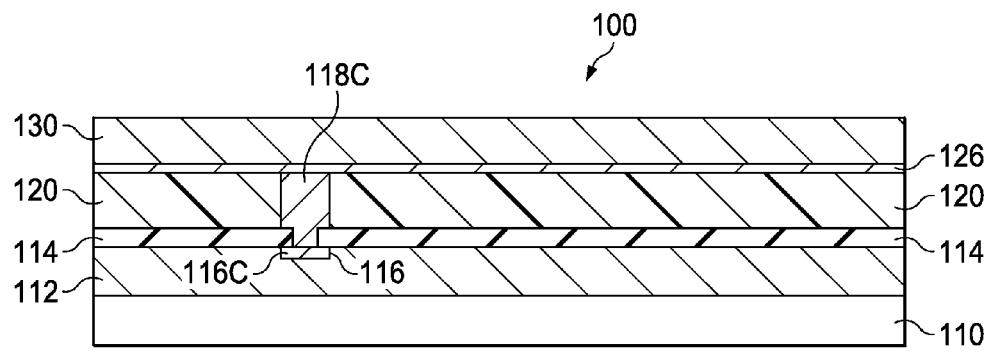
Figure 3D:
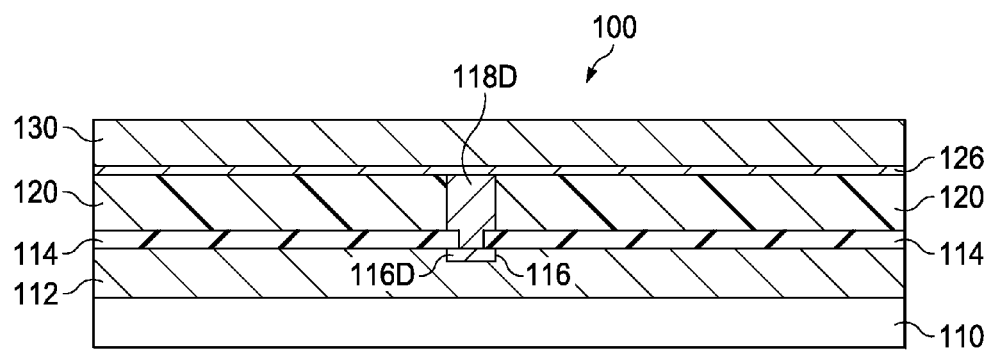
Figure 4A:
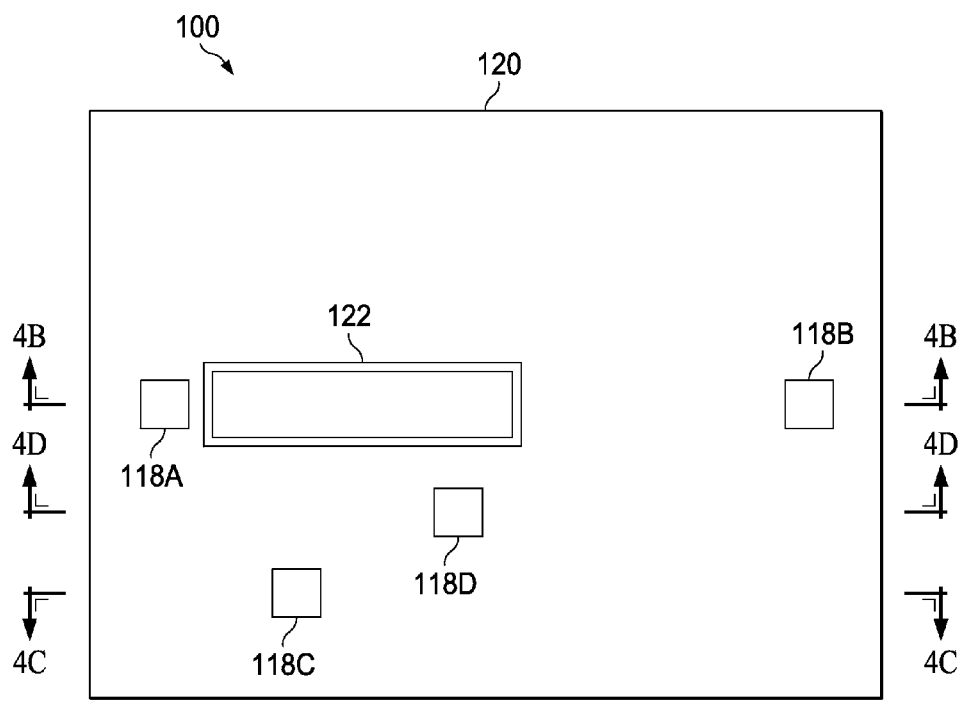
Figure 4B:
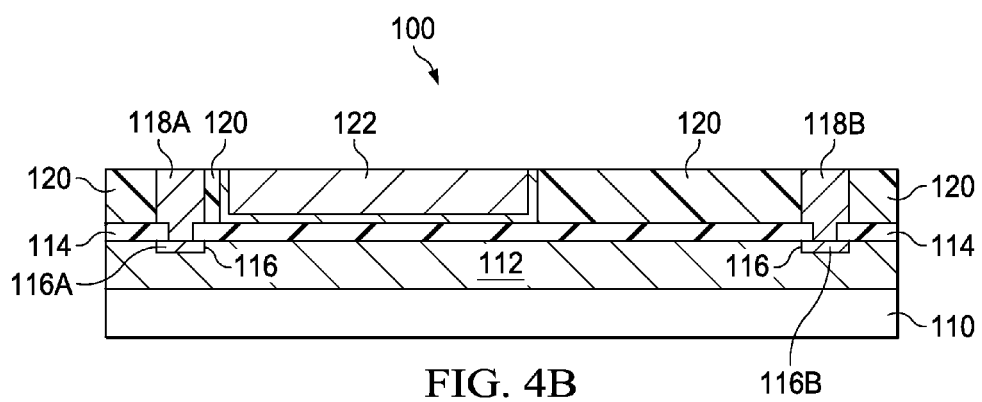
Figure 4C:
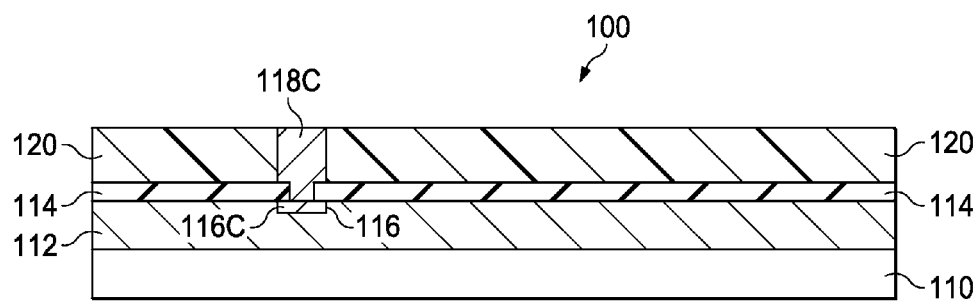
Figure 4D:
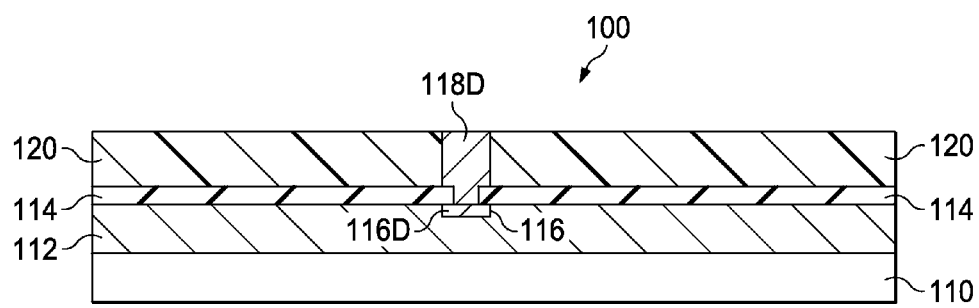
Figure 5A:
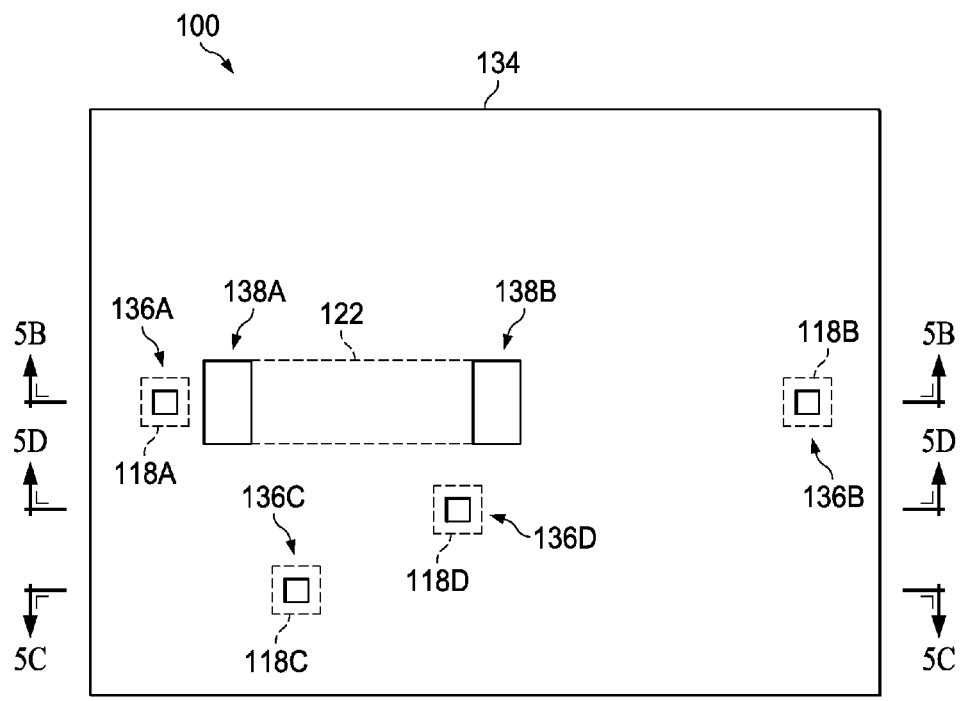
Figure 5B:
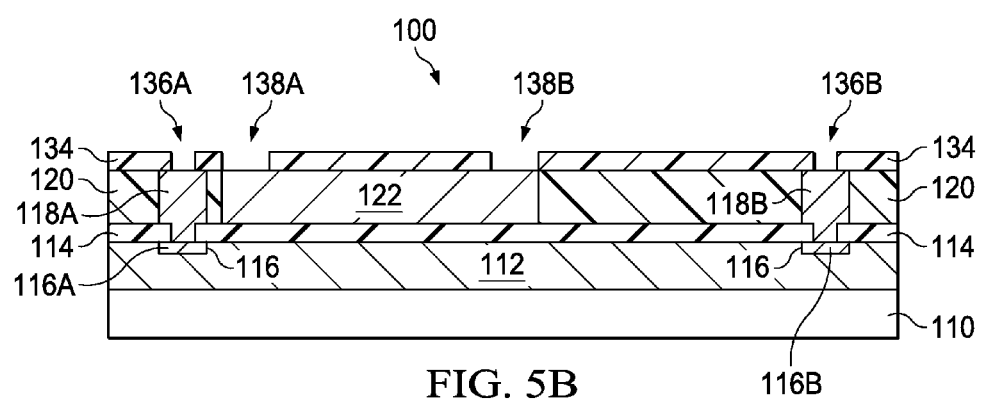
Figure 5C:
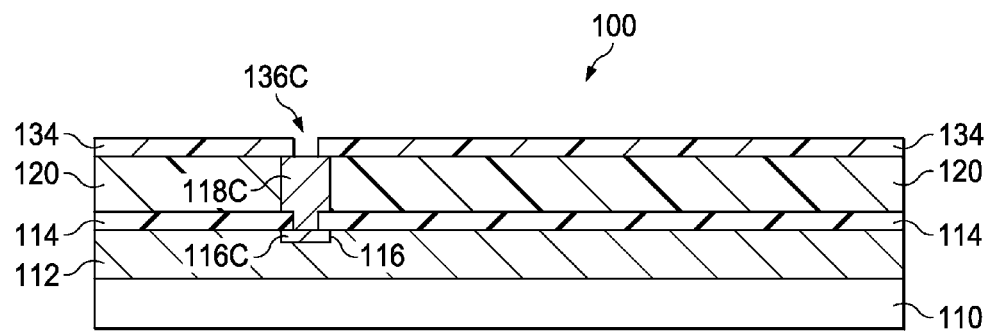
Figure 5D:
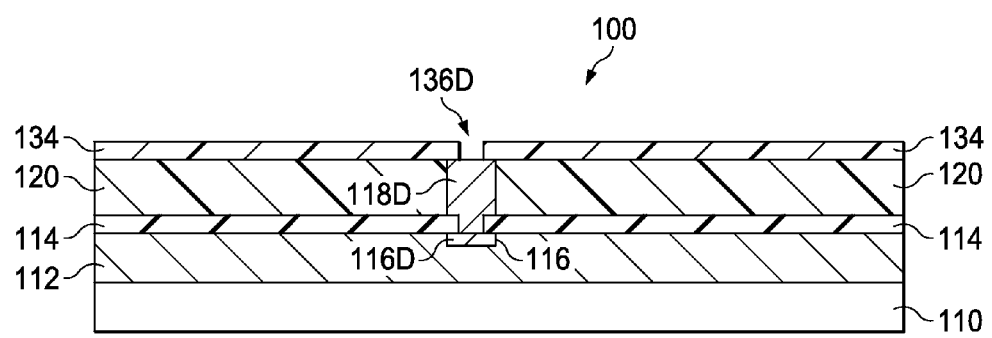
Figure 6A:
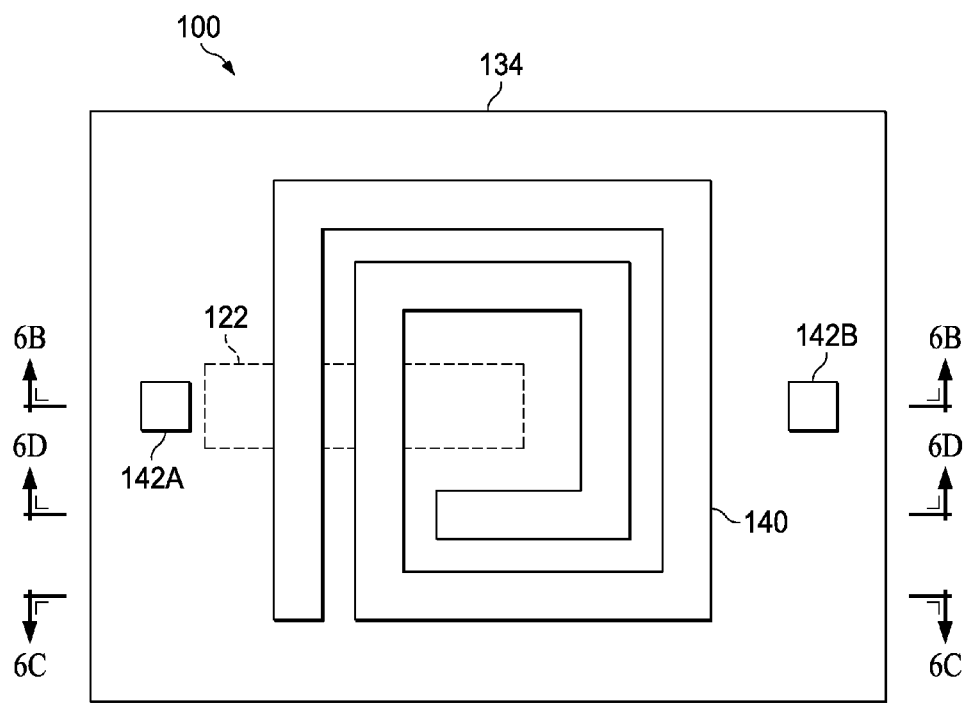
Figure 6B:
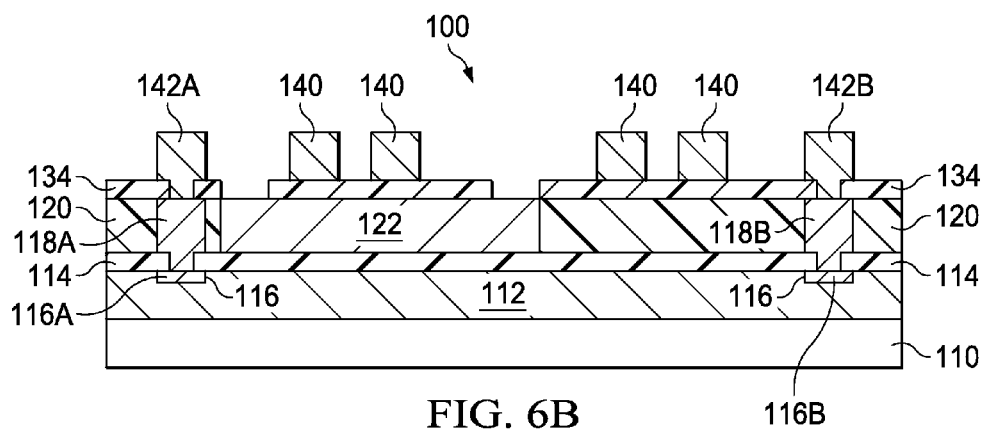
Figure 6C:
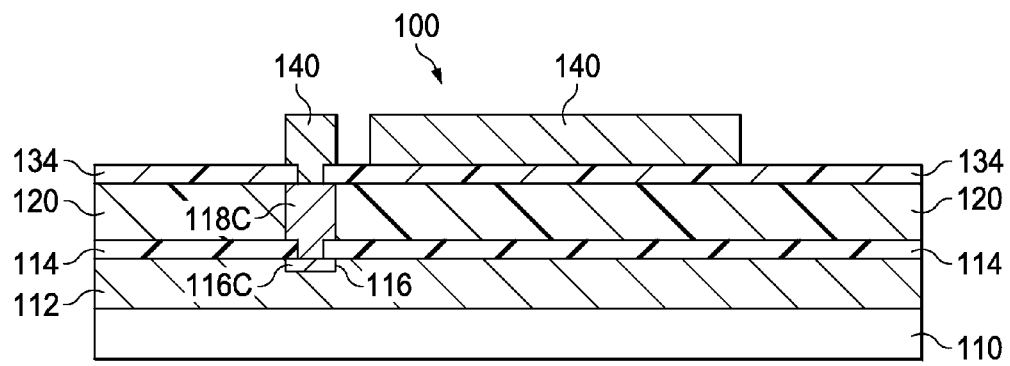
Figure 6D:
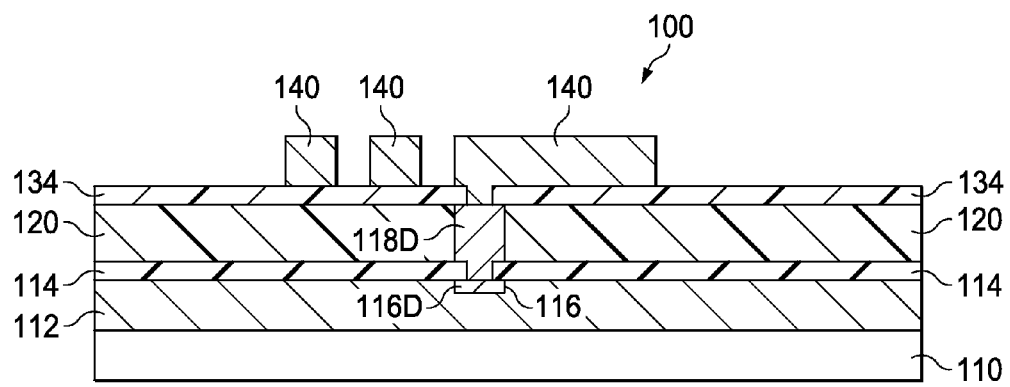
Figure 7A:
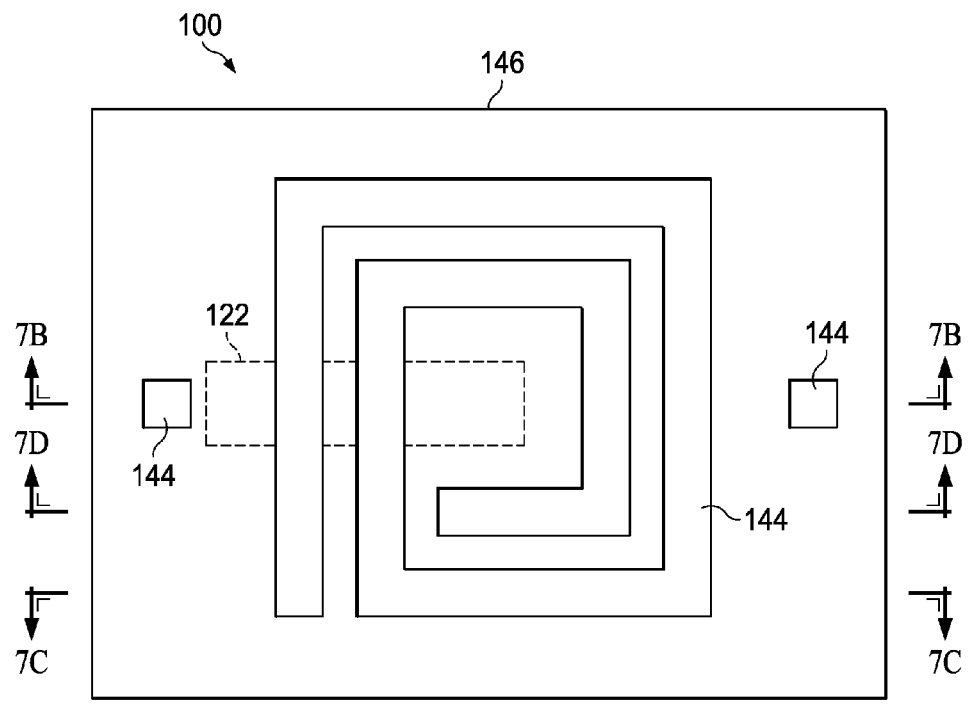
Figure 7B:
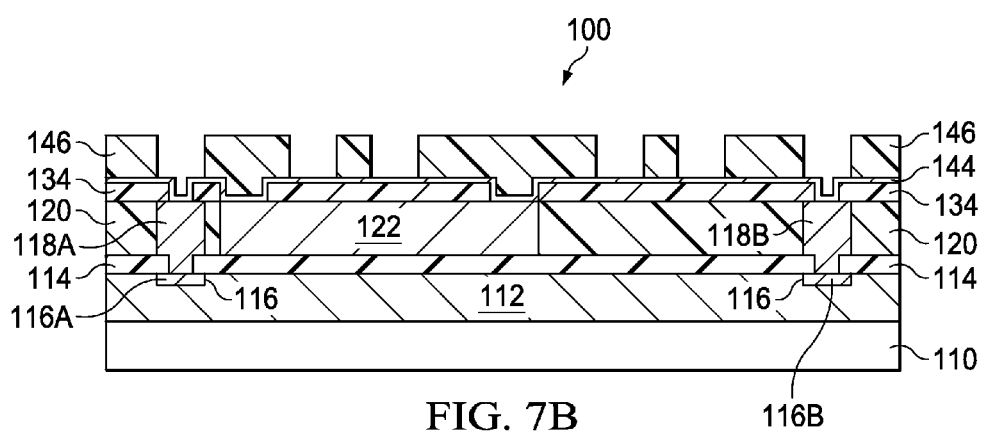
Figure 7C:
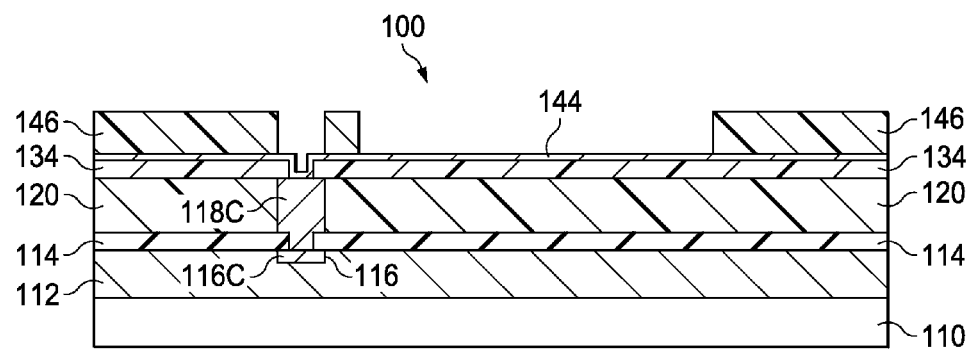
Figure 7D:
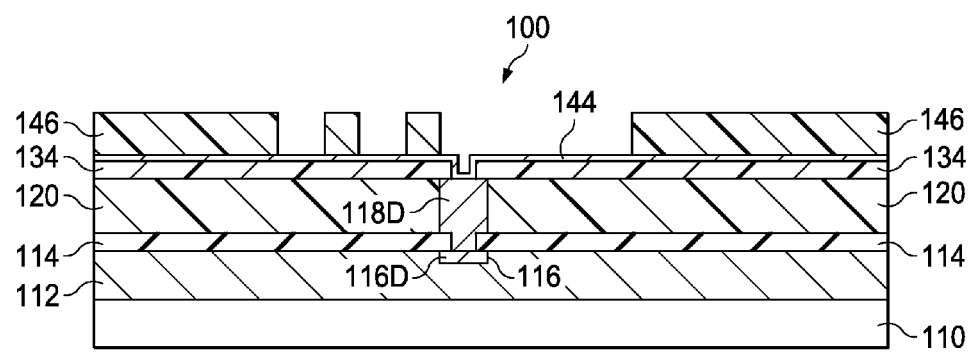
Figure 8A:
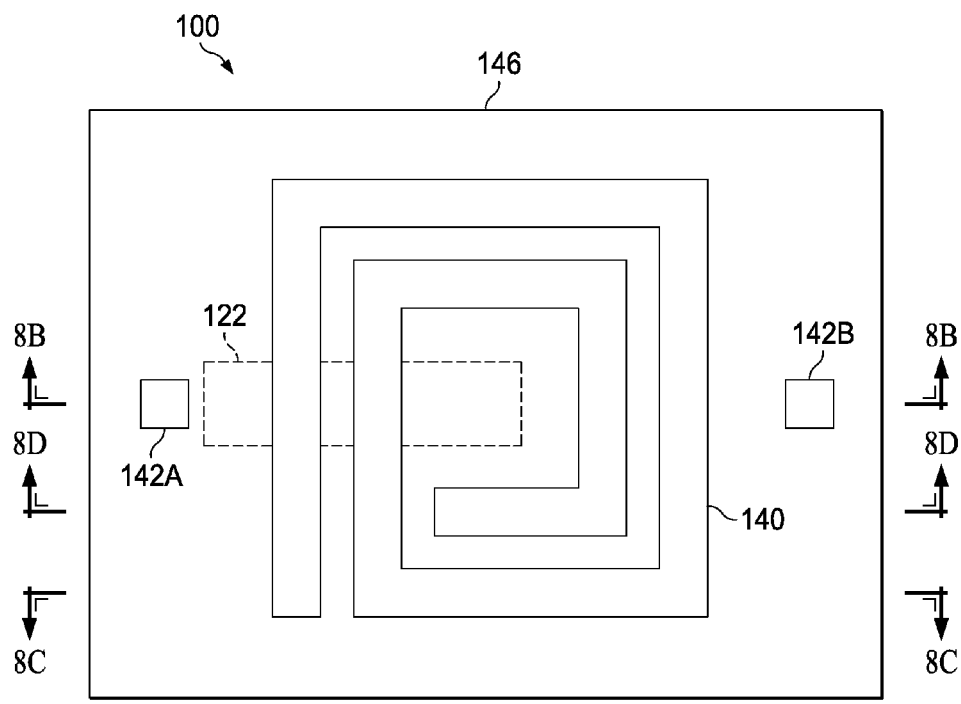
Figure 8B:
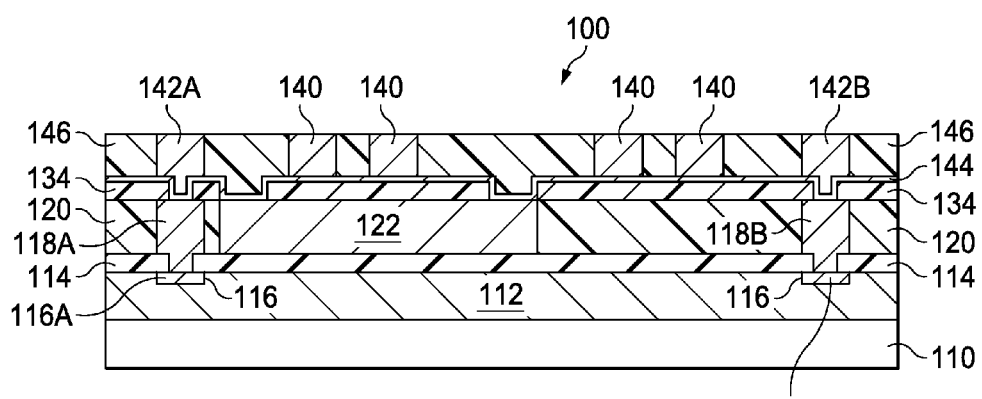
Figure 8C:
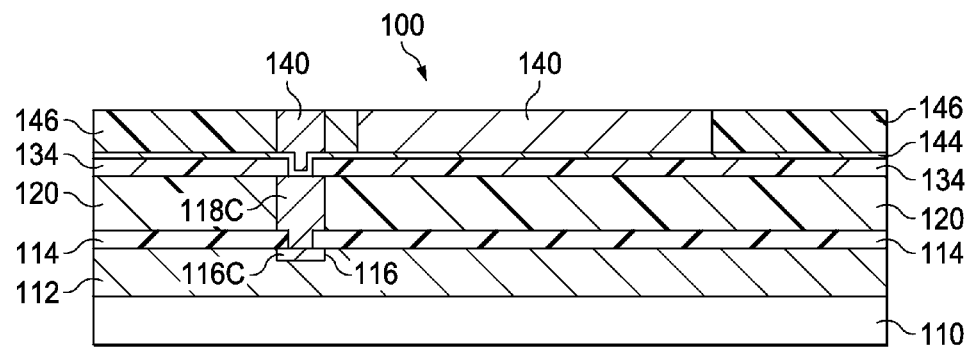
Figure 8D:
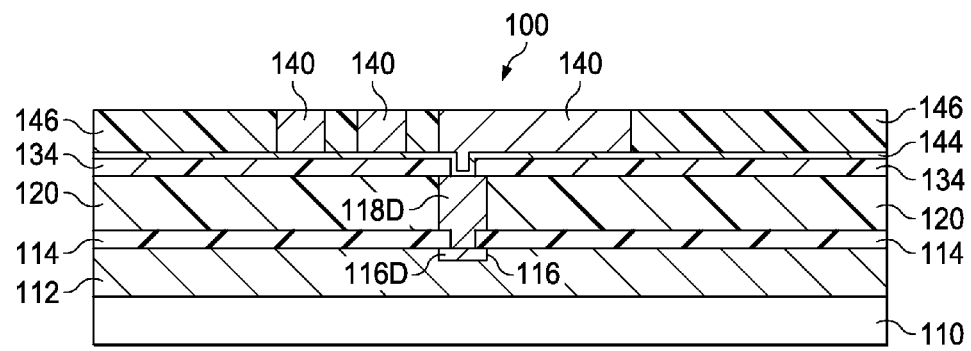
Figure 9A:
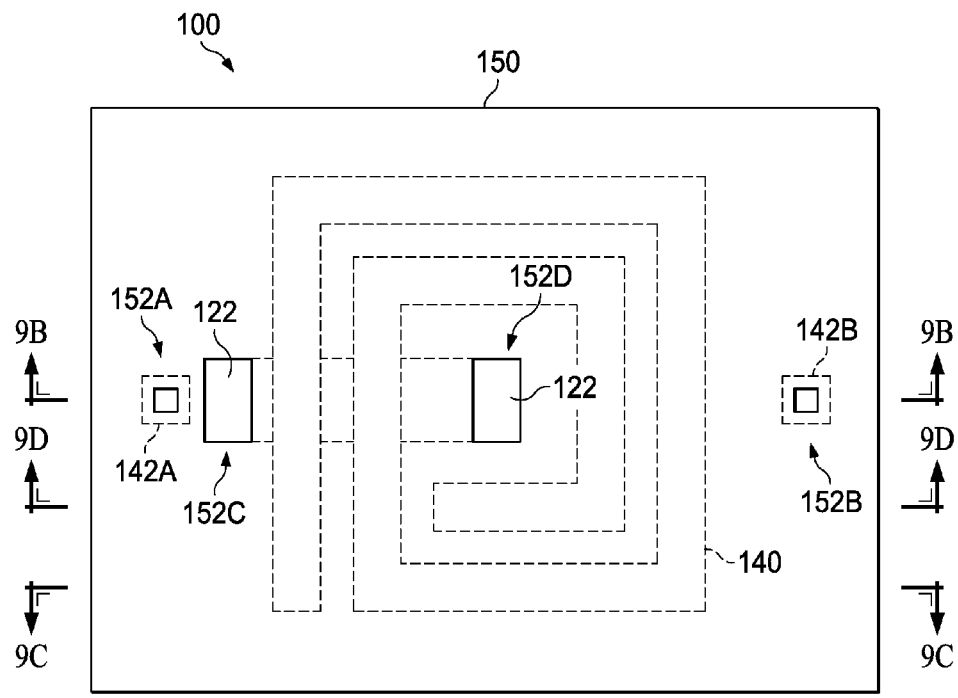
Figure 9B:
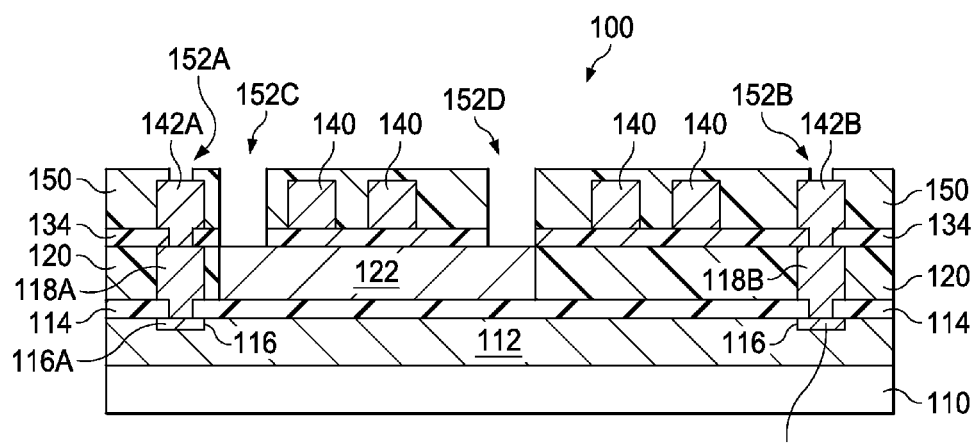
Figure 9C:
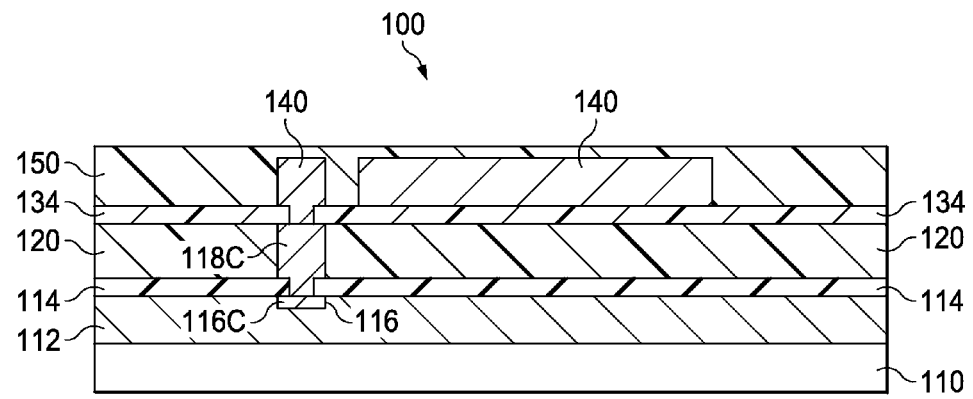
Figure 9D:
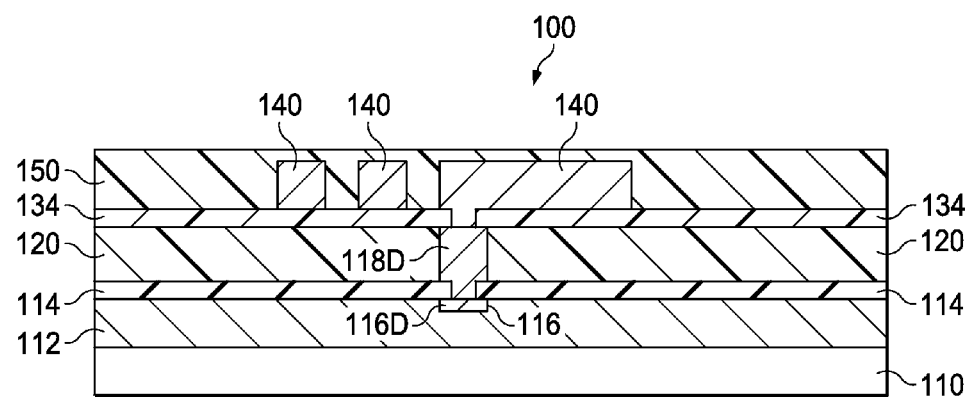
Figure 10A:
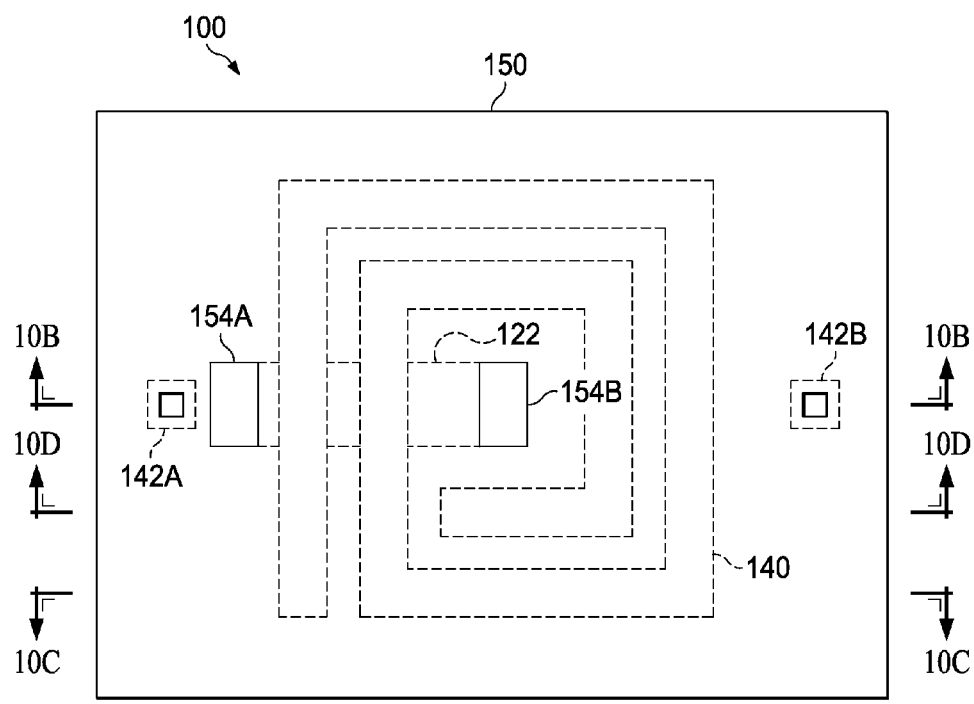
Figure 10B:
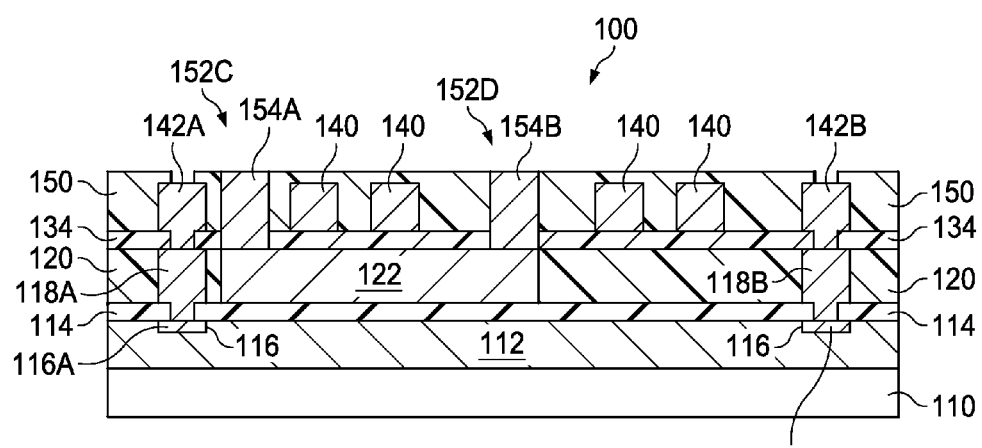
Figure 10C:
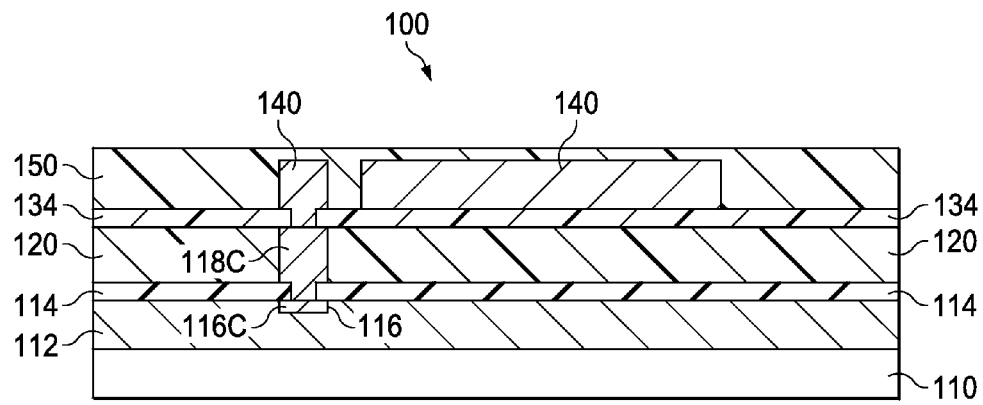
Figure 10D:
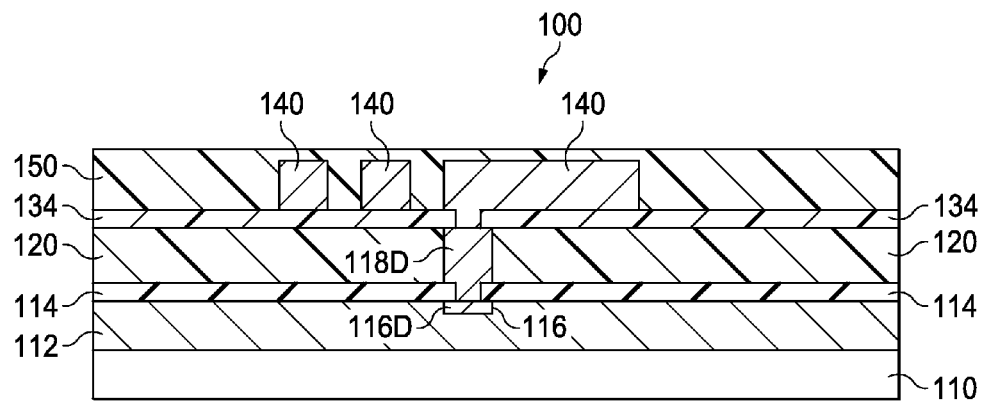
Figure 11A:
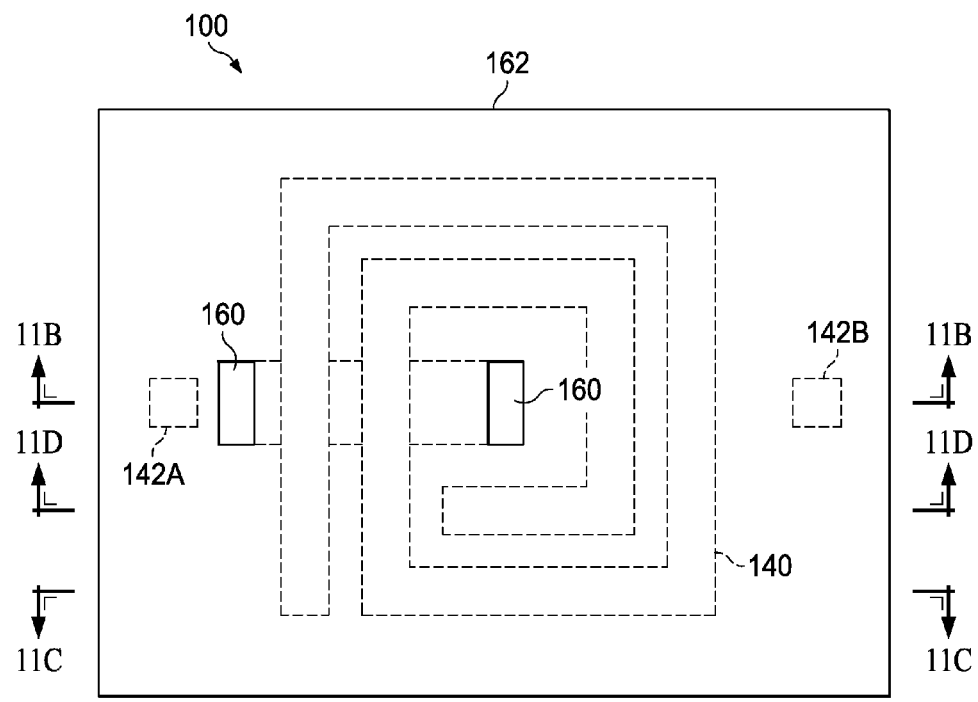
Figure 11B:
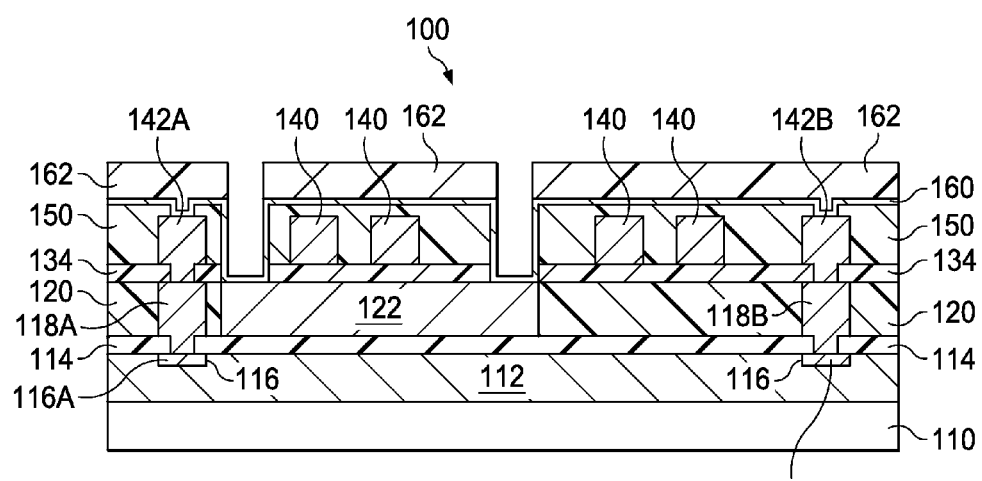
Figure 11C:
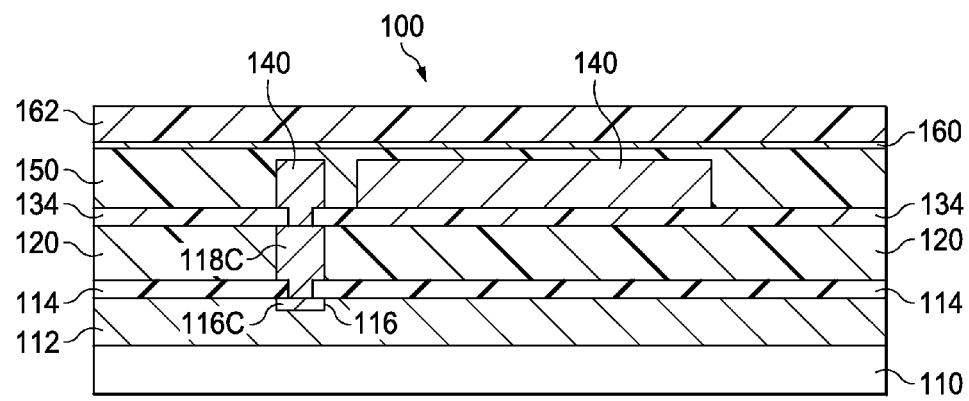
Figure 11D:
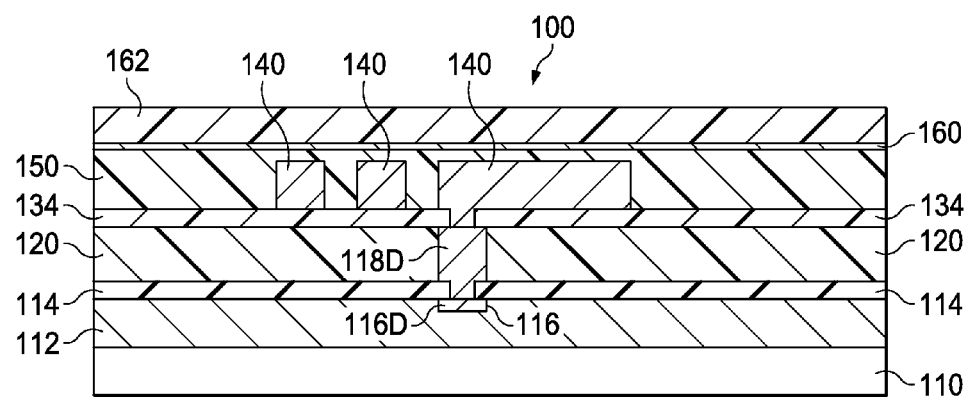
Figure 12A:
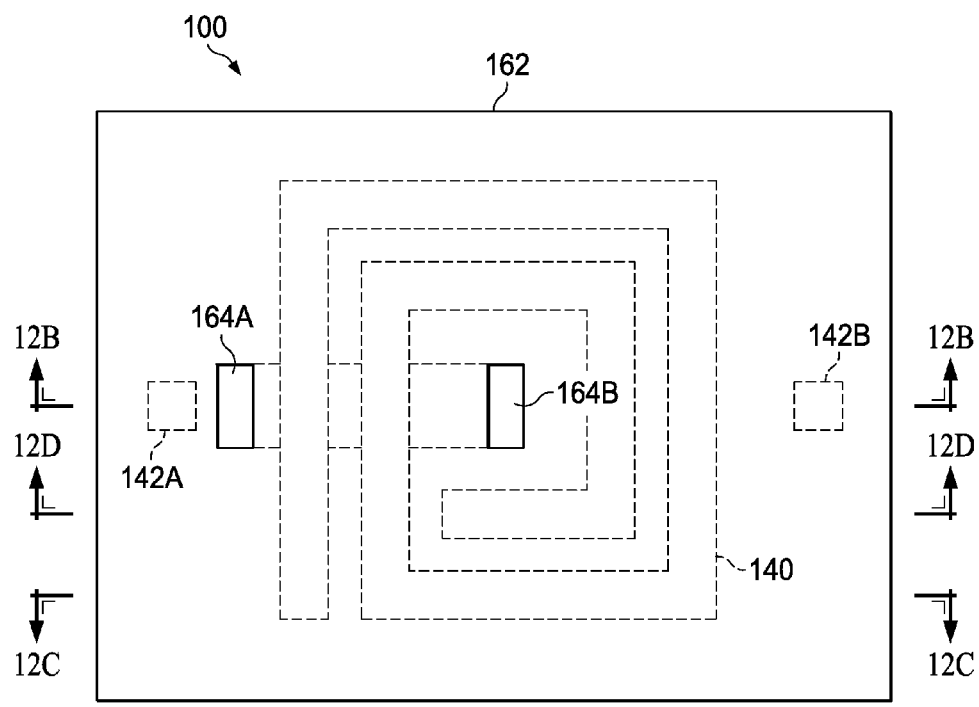
Figure 12B:
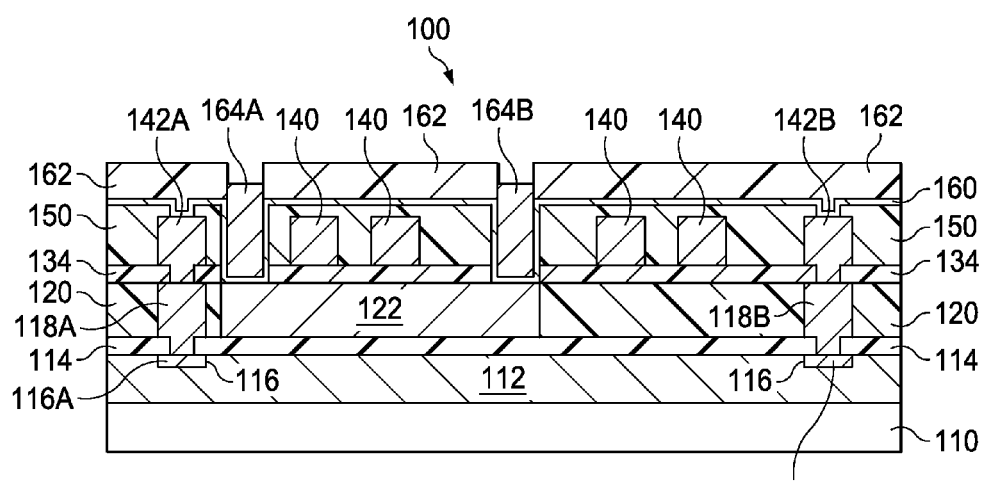
Figure 12C:
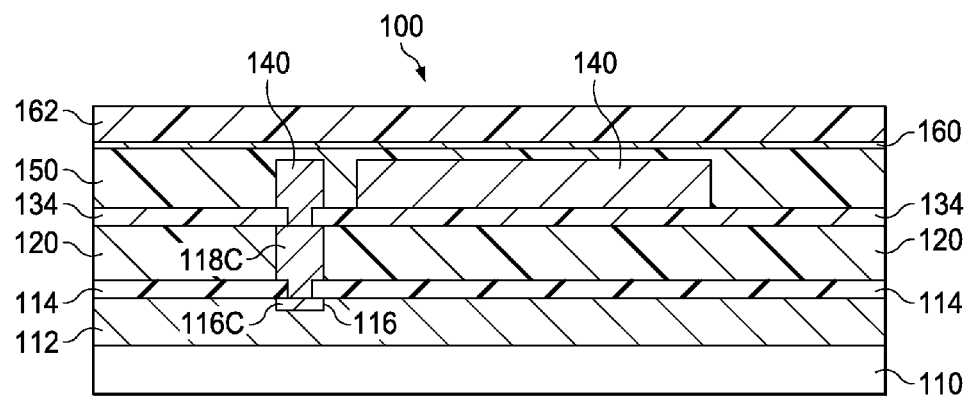
Figure 12D:
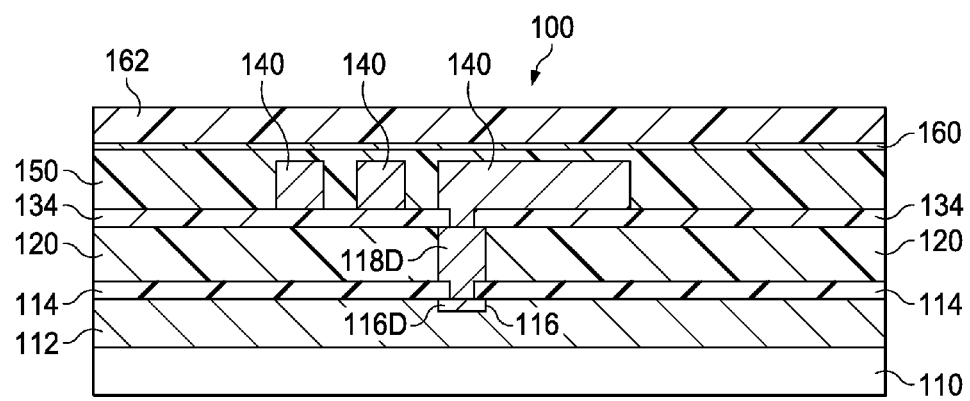
Figure 13A:
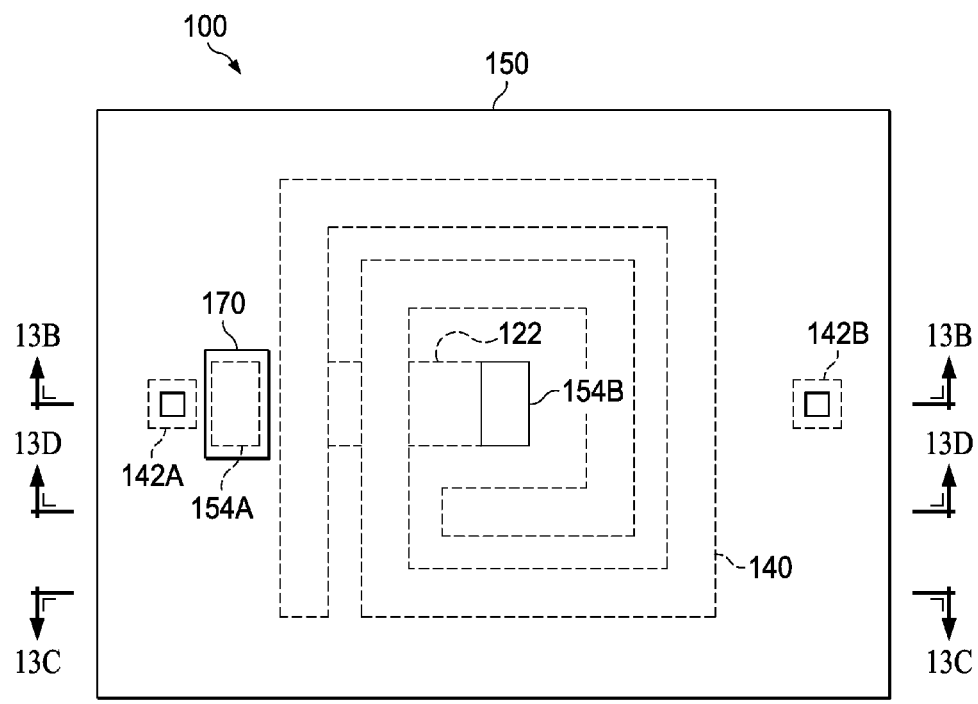
Figure 13B:
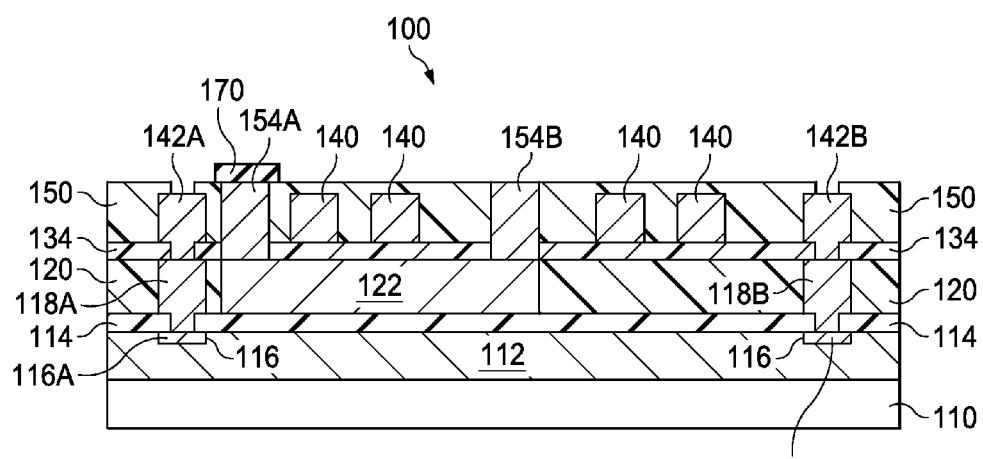
Figure 13C:
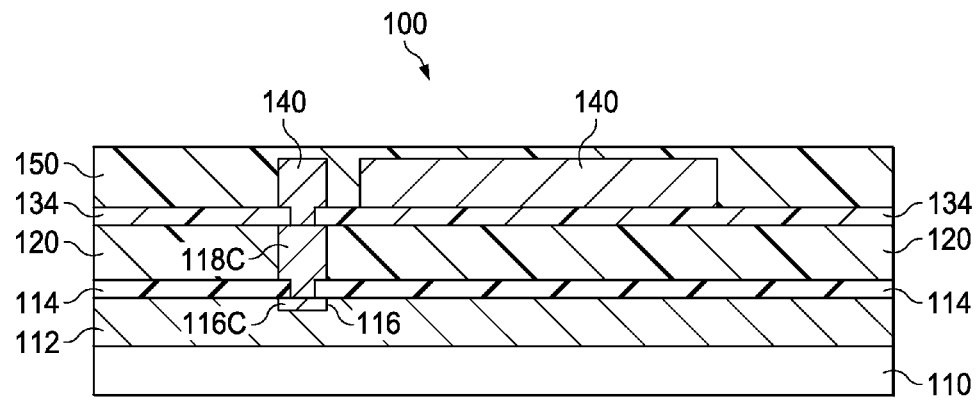
Figure 13D:
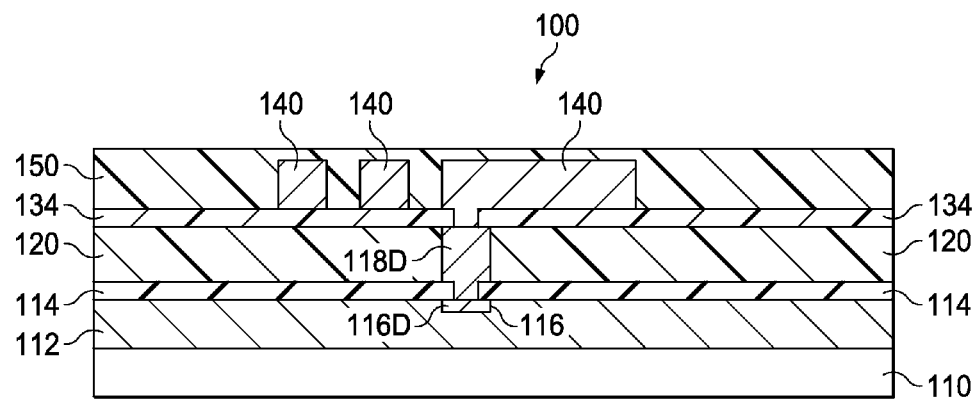
Figure 14A:
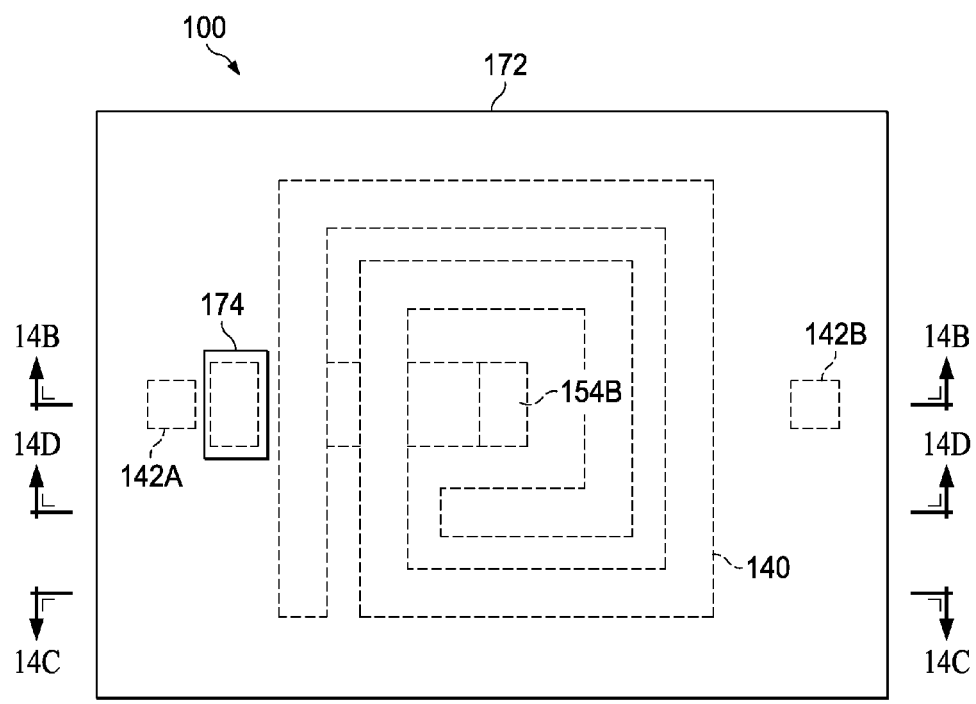
Figure 14B:
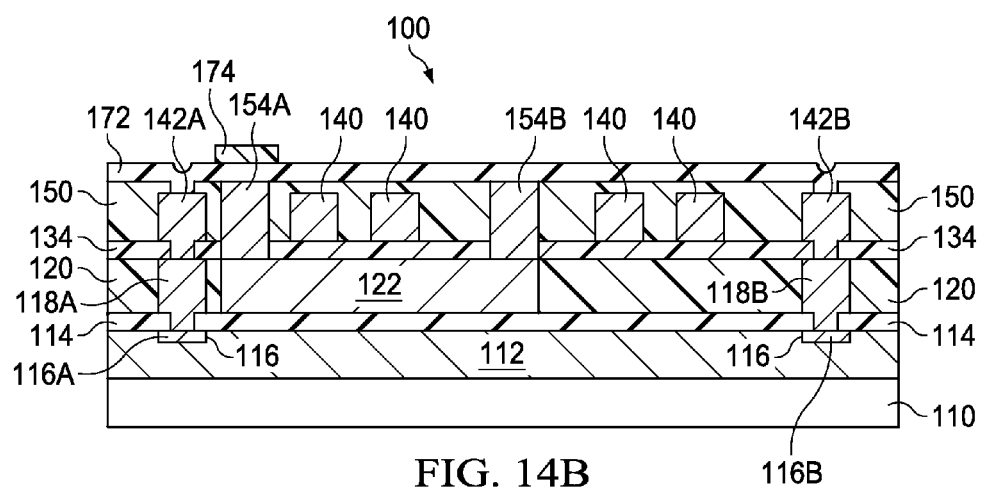
Figure 14C:
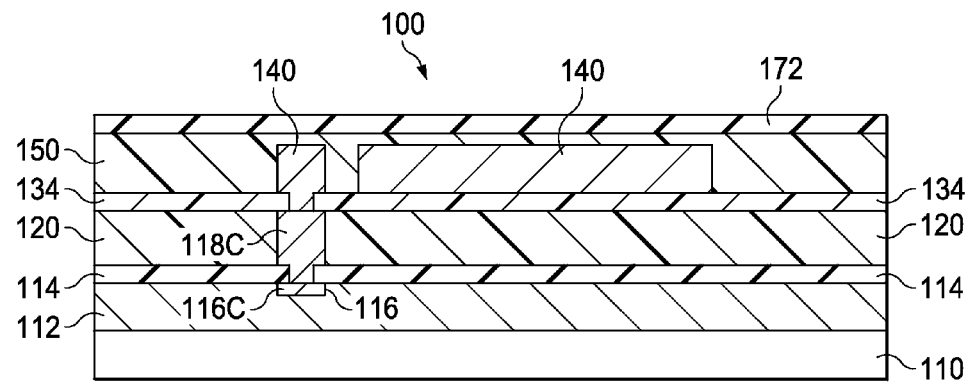
Figure 14D:
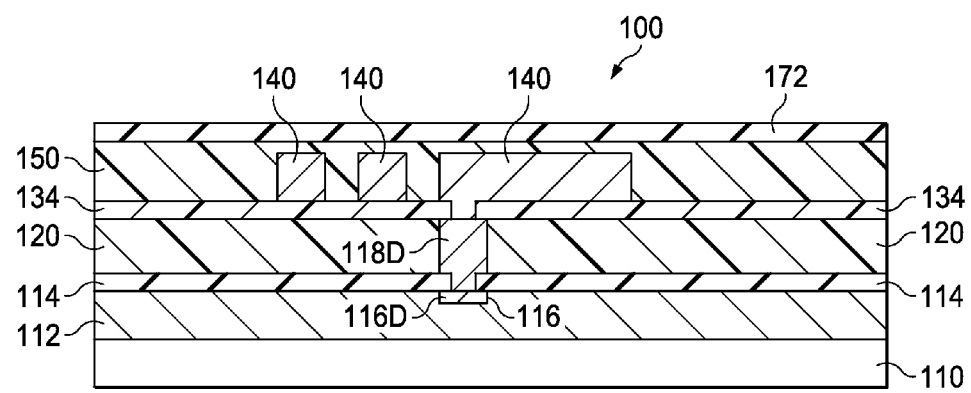
Figure 15A:
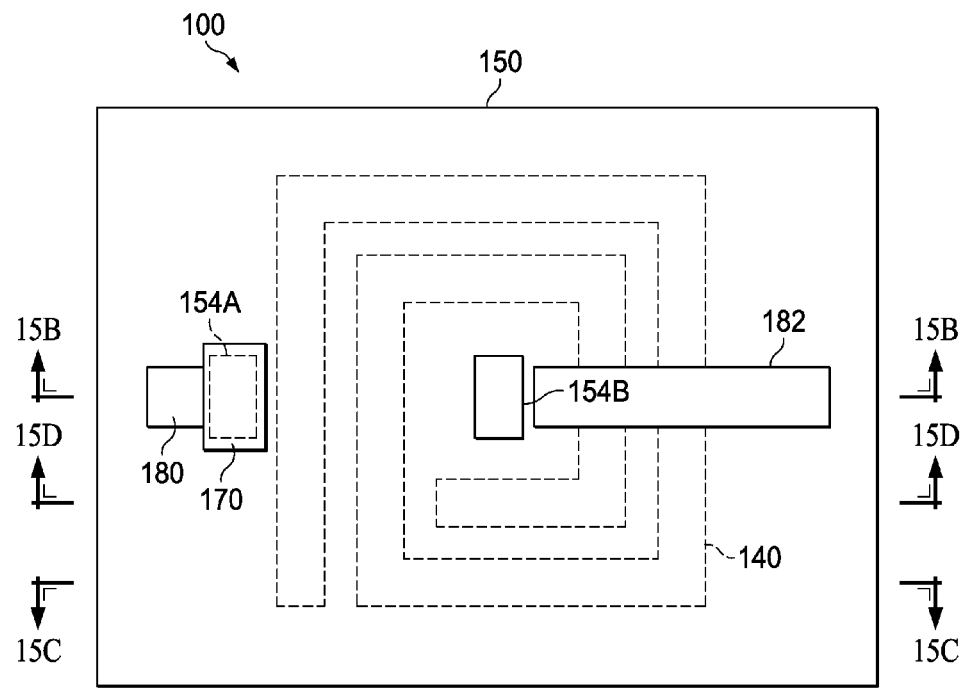
Figure 15B:
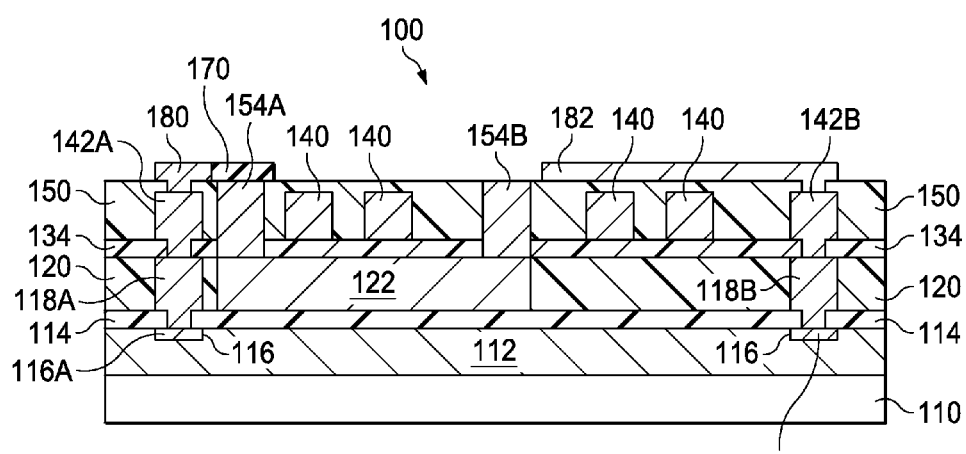
Figure 15C:
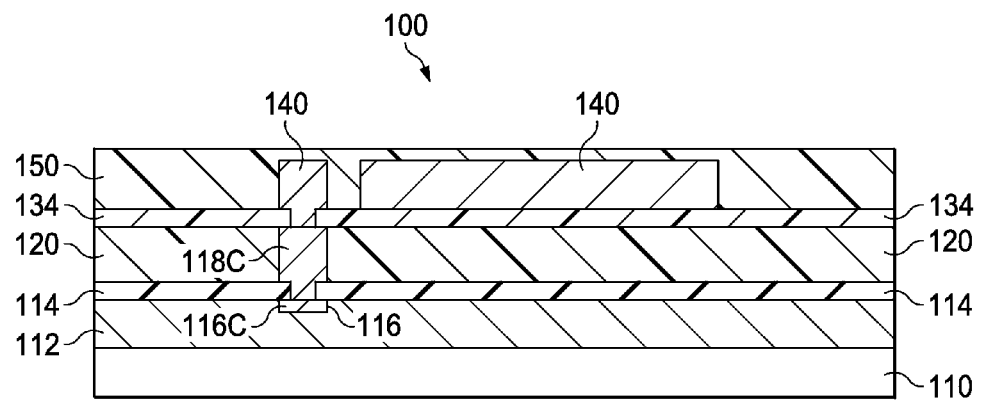
Figure 15D:
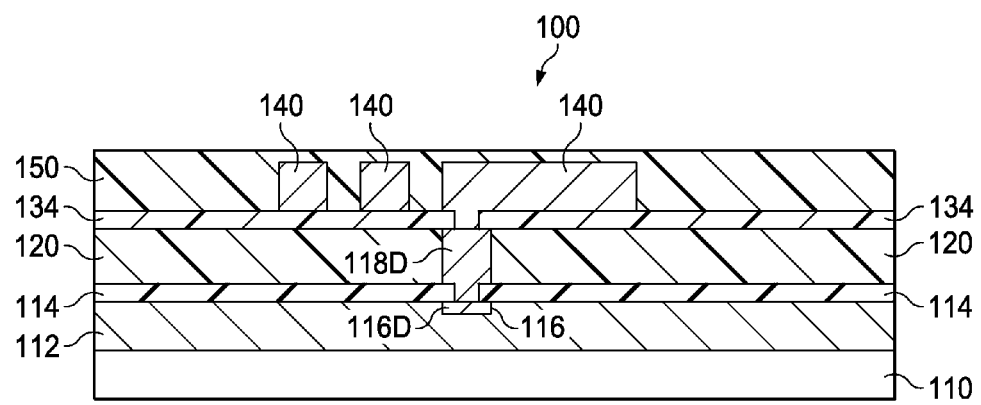
Figure 16A:
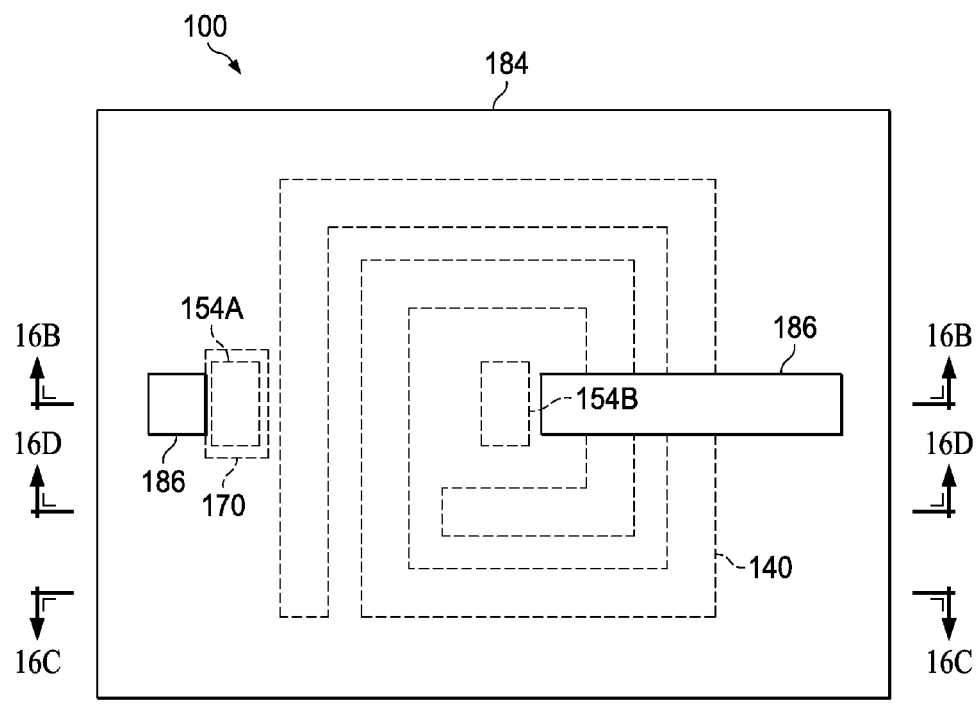
Figure 16B:
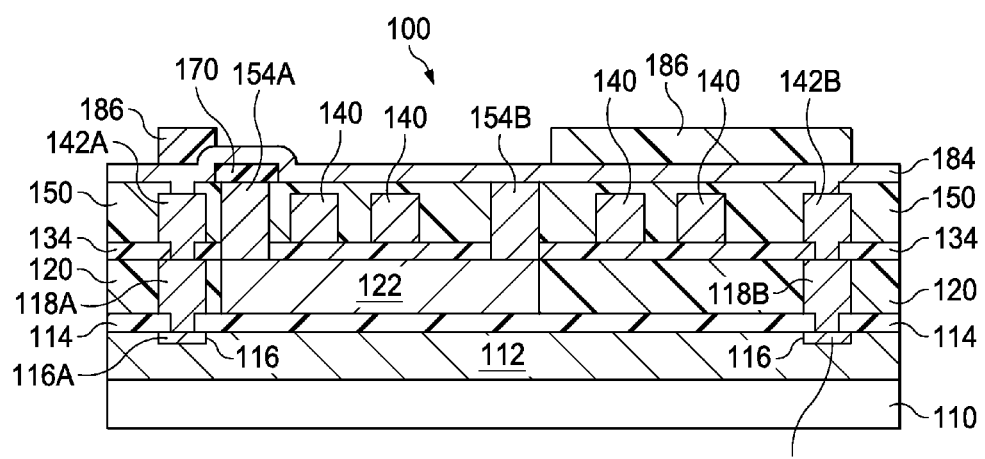
Figure 16C:
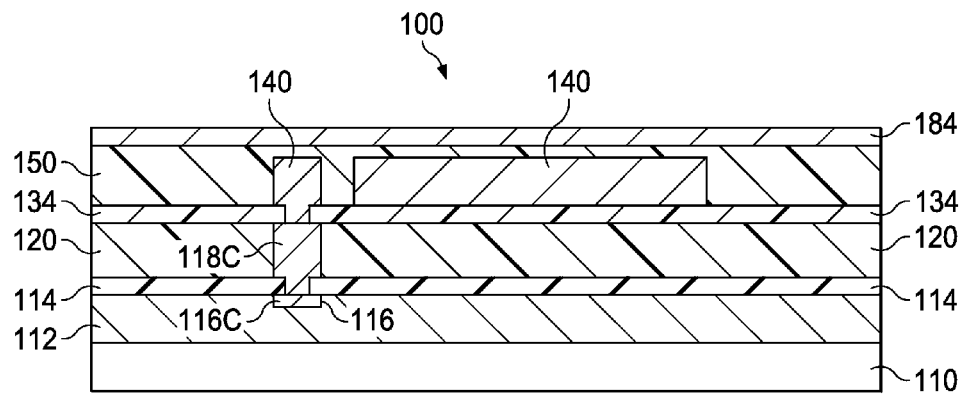
Figure 16D:
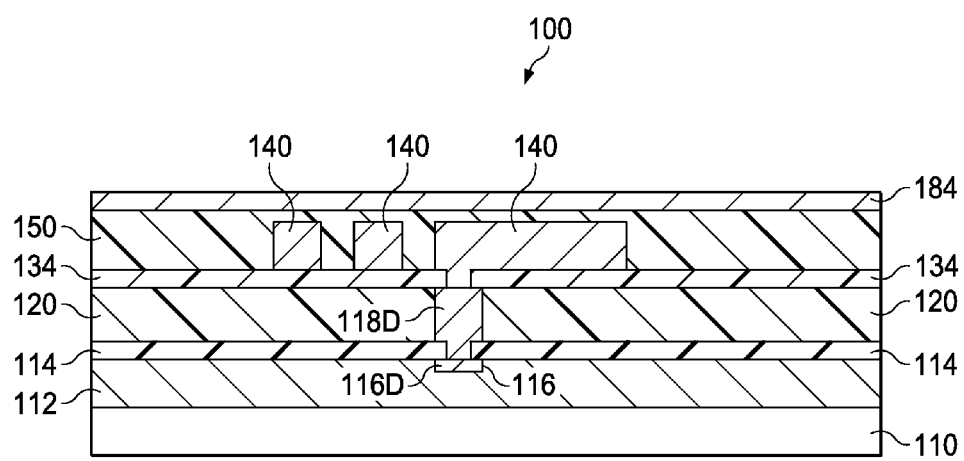
Figure 17A:
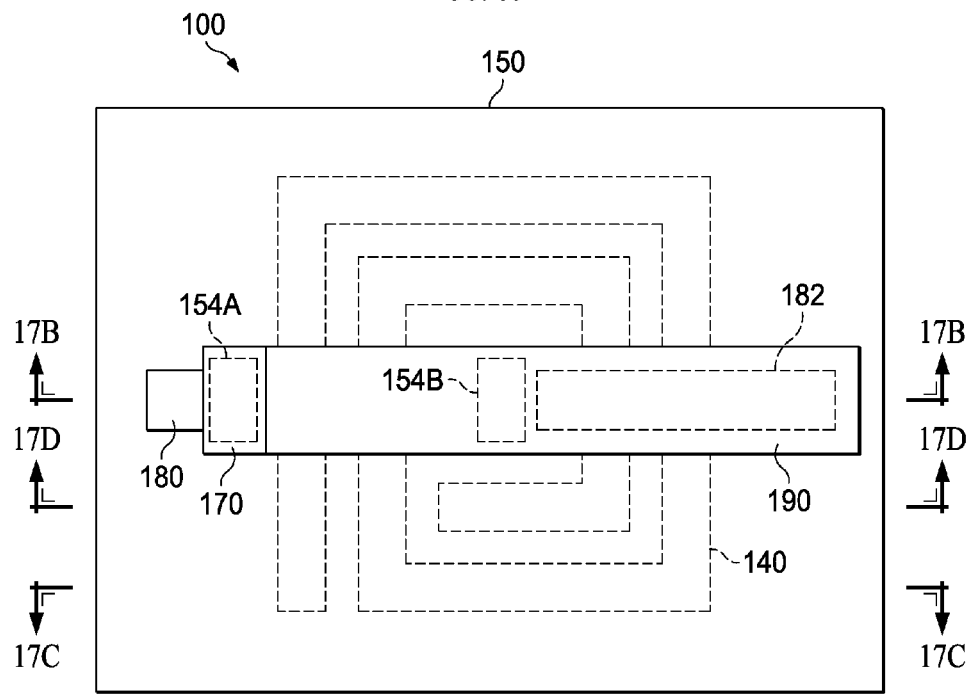
Figure 17B:
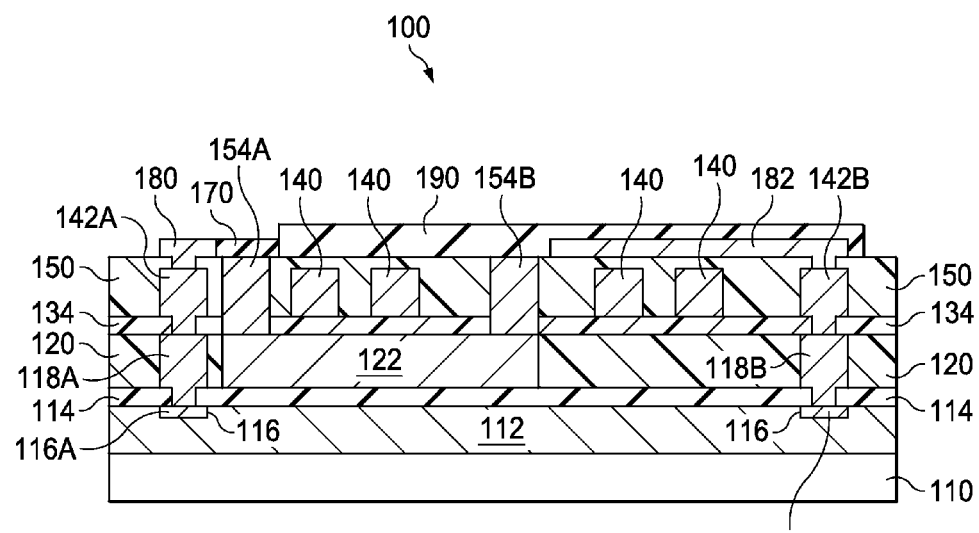
Figure 17C:
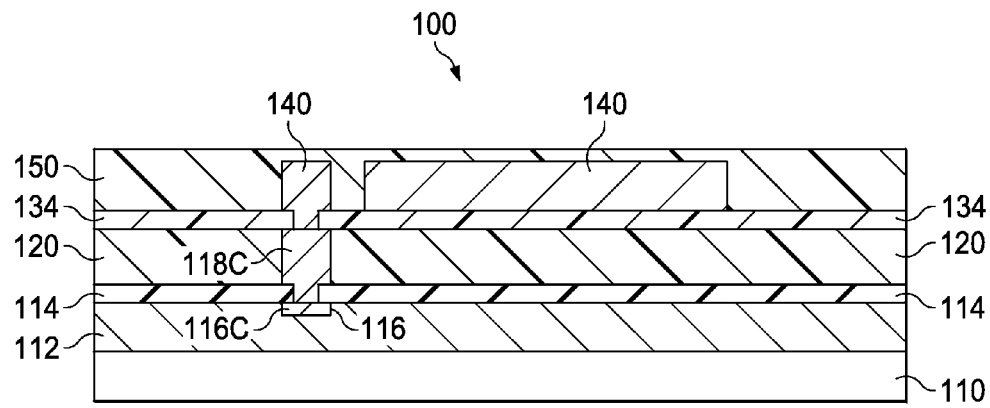
Figure 17D:
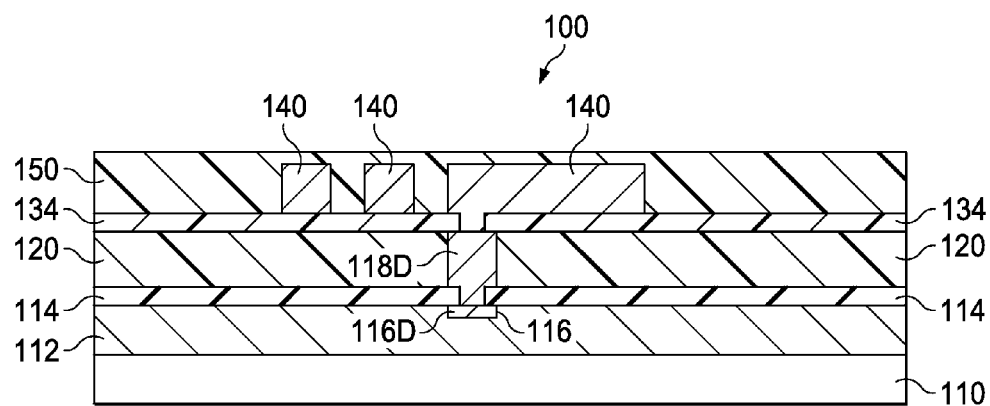
Figure 18A:
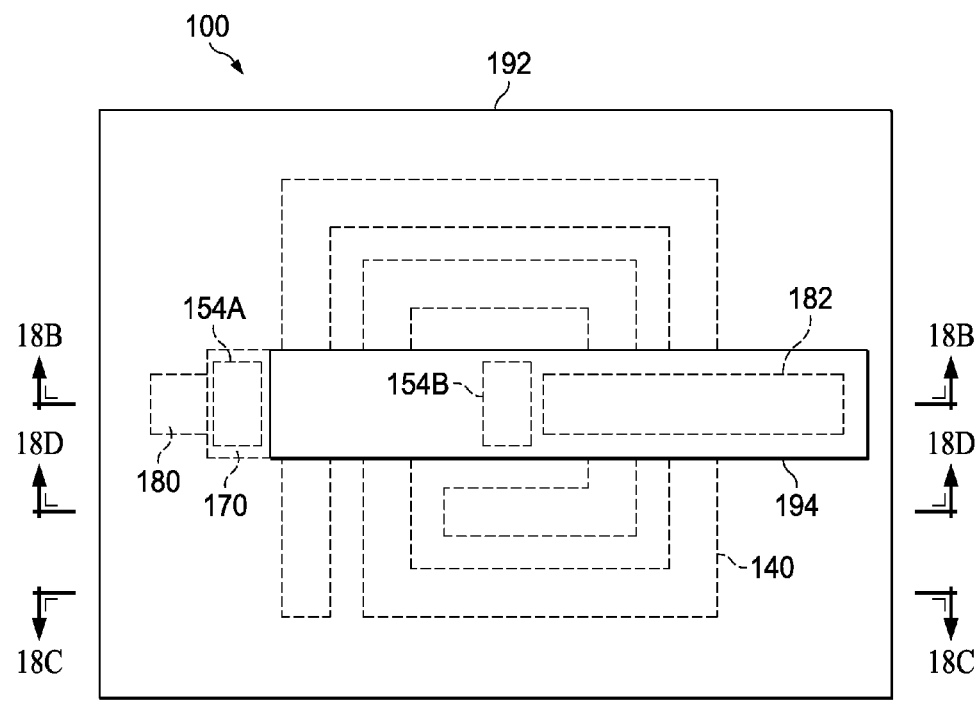
Figure 18B:
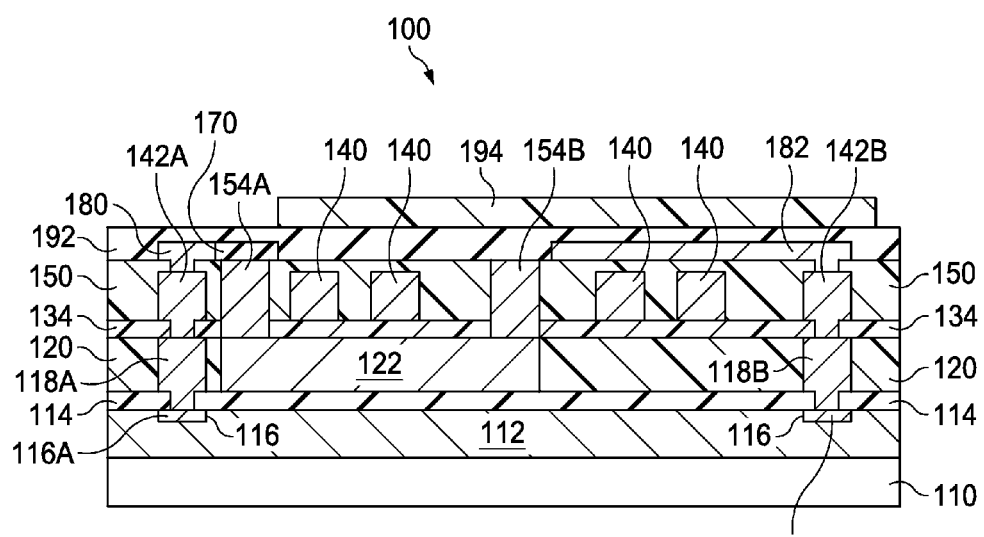
Figure 18C:
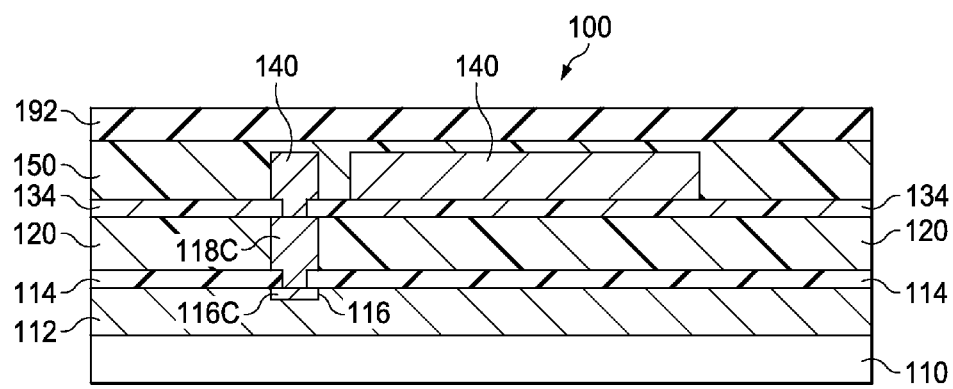
Figure 18D:
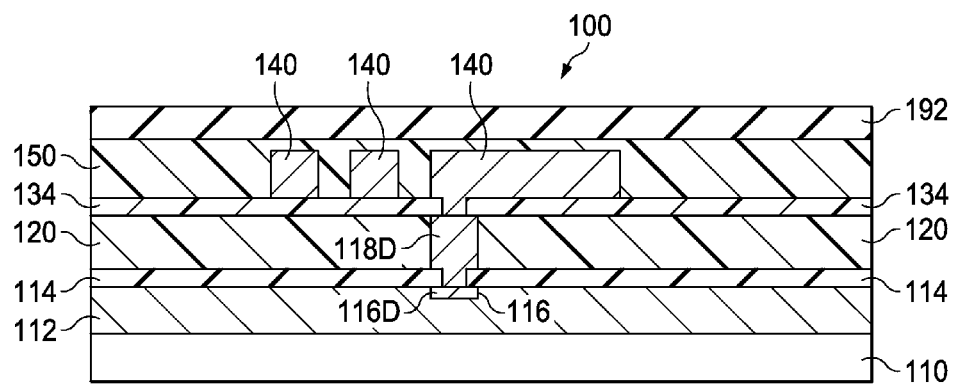
Figure 19A:
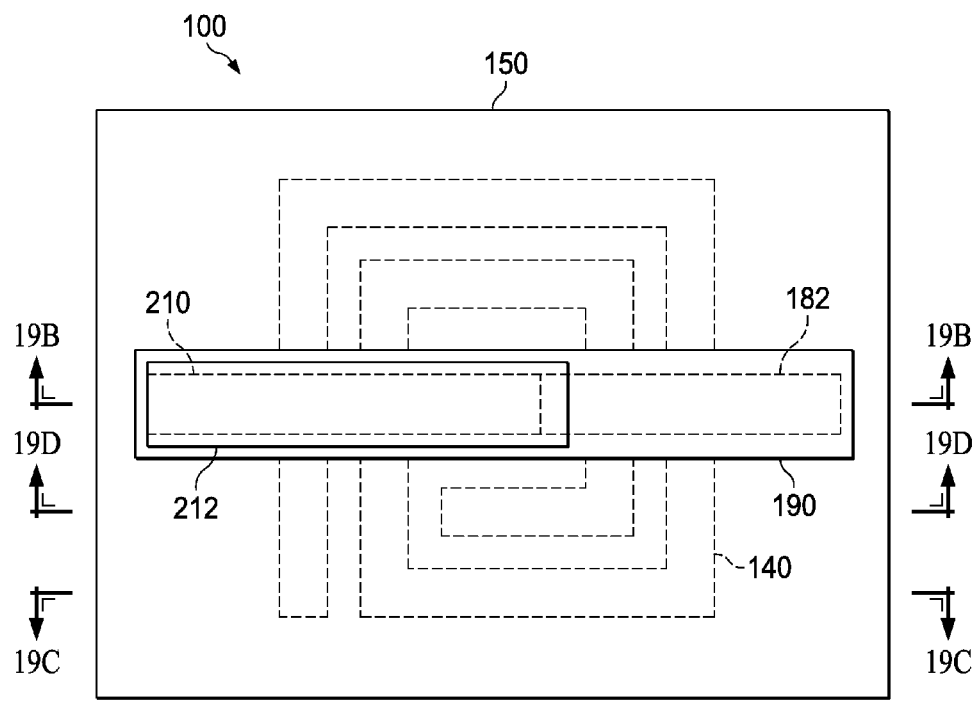
Figure 19B:
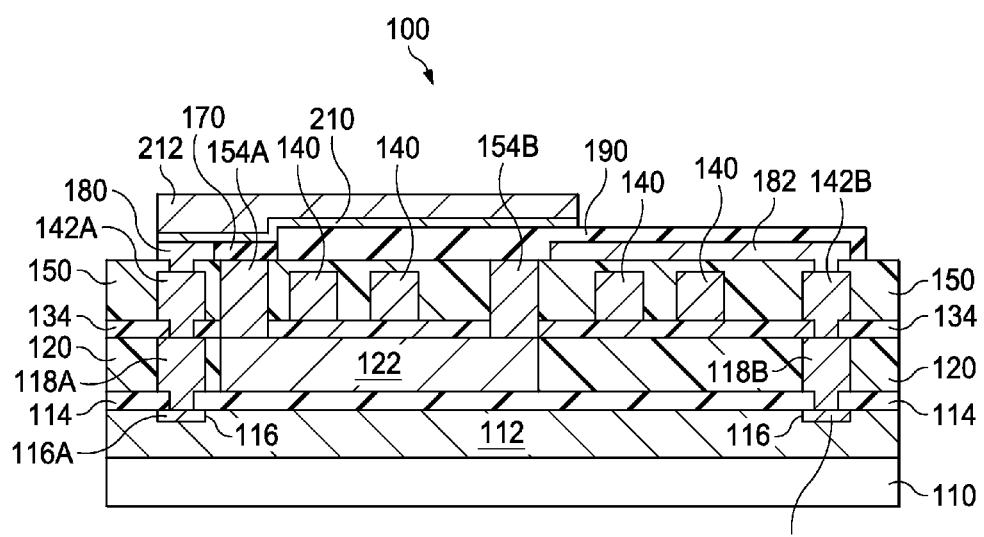
Figure 19C:
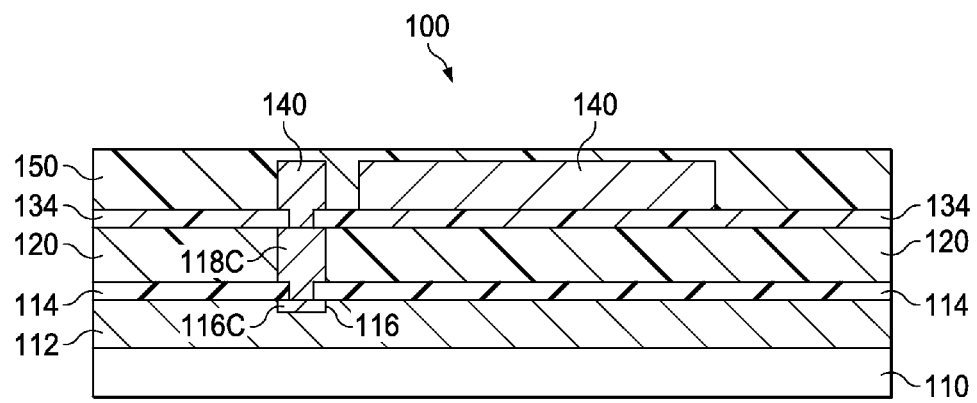
Figure 19D:
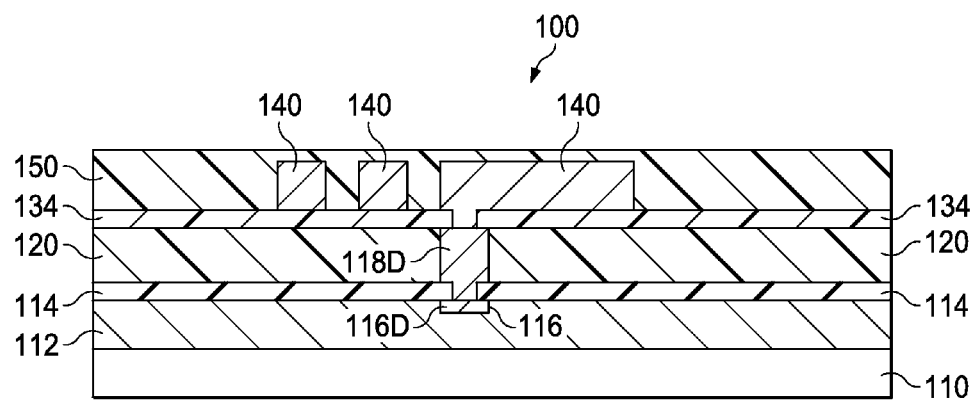
Figure 20A:
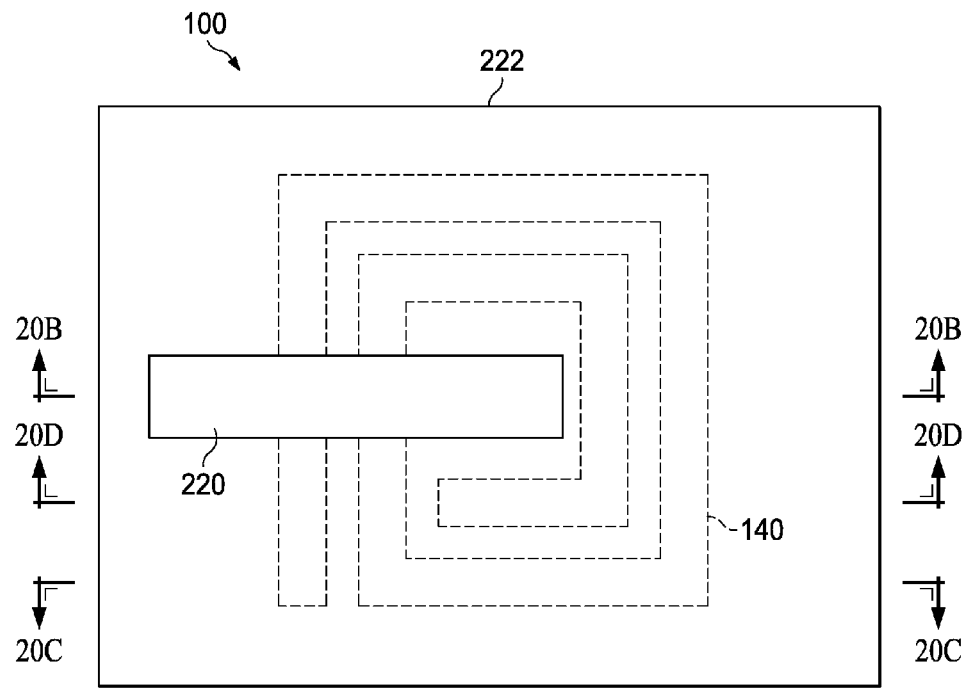
Figure 20B:
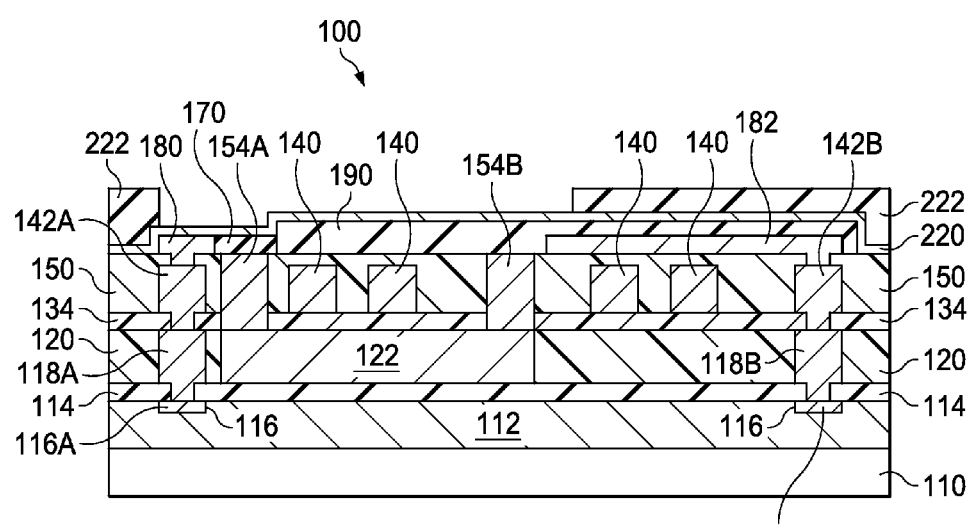
Figure 20C:
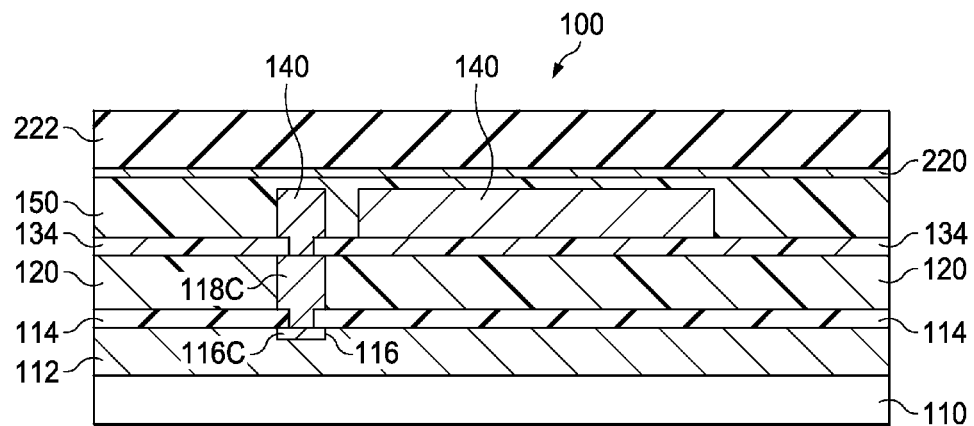
Figure 20D:
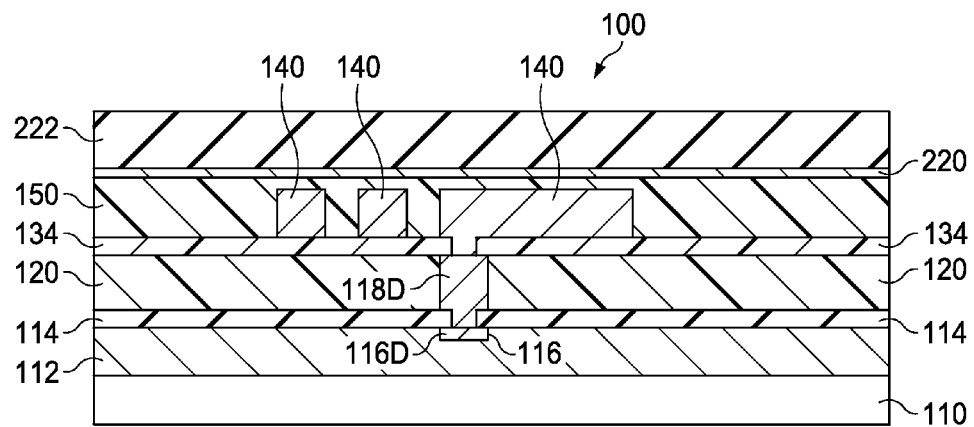
Figure 21A:
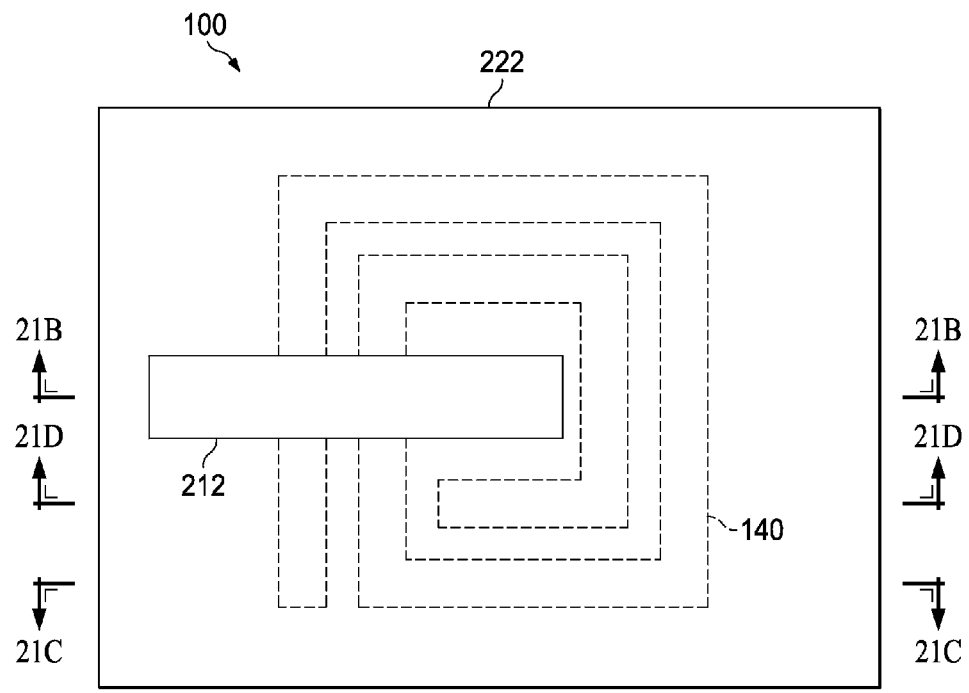
Figure 21B:
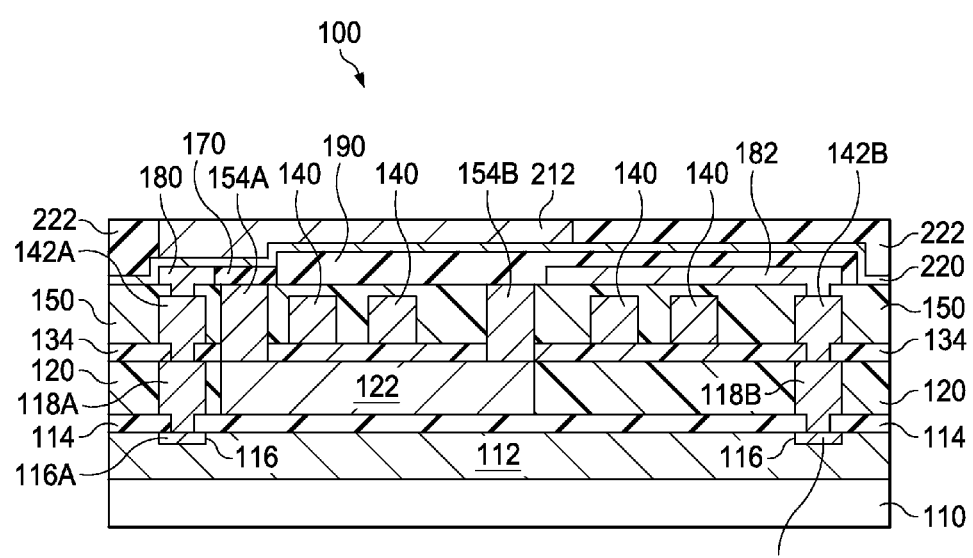
Figure 21C:
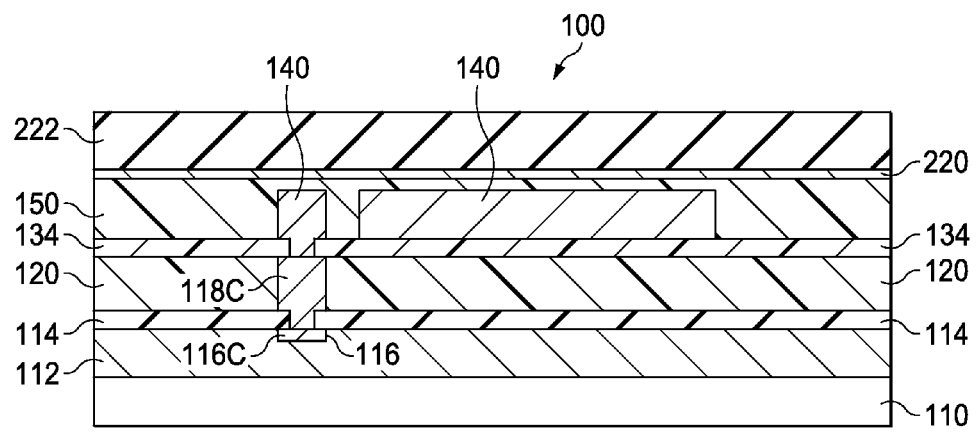
Figure 21D:
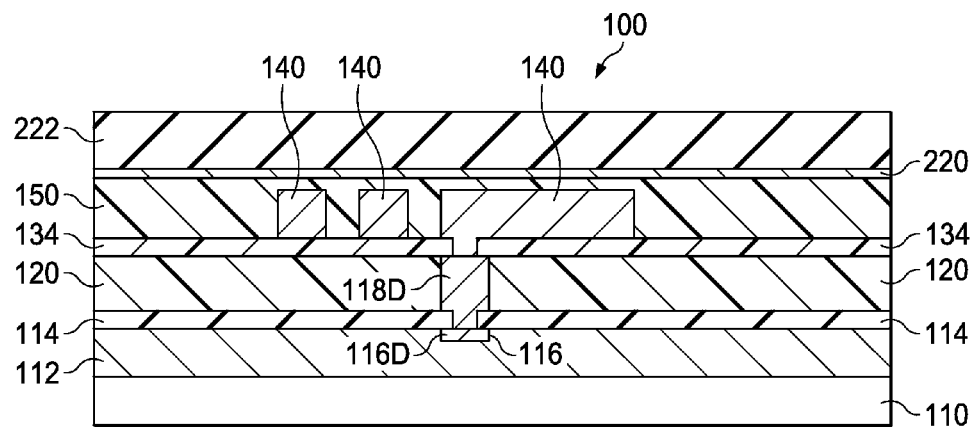

FIGS. 1A-1D through FIGS. 22A-22D show views that illustrate an example of a method of forming a MEMS relay in accordance with the present invention. FIGS. 1A-22A show plan views, while FIGS. 1B-22B show cross-sectional views taken along lines 1B-1B through 22B-22B in FIGS. 1A-22A, FIGS. 1C-22C show cross-sectional views taken along lines 1C-1C through 22C-22C in FIGS. 1A-22A, and FIGS. 1D-22D show cross-sectional views taken along lines 1D-1D through 22D-22D in FIGS. 1A-22A.

As shown in FIGS. 1A-1D, the method utilizes a conventionally-formed semiconductor wafer 100 that has a semiconductor structure 110, and a metal interconnect structure 112 that touches the top surface of semiconductor structure 110. In the present example, semiconductor structure 110 includes a large number of electrical devices, such as transistors, resistors, capacitors, and diodes.

Further, metal interconnect structure 112, which electrically connects together the electrical devices in semiconductor structure 110 to form a circuit, includes a number of levels of metal traces, a large number of contacts that connect the bottom metal trace to electrically conductive regions on semiconductor structure 110, and a large number of inter-metal vias that connect the metal traces in adjacent layers together.

In addition, metal interconnect structure 112 includes a top passivation layer 114 with openings that expose a number of conductive pads 116. The pads 116, in turn, are selected regions of the metal traces in the top metal layer that provide points for external electrical connections, and points for electrical connections to overlying devices.

In the present example, the pads 116 include a pair of switch pads 116A and 116B which provide input and output electrical connections for a to-be-formed switch, and a pair of coil pads 116C and 116D which provide input and output electrical connections for a to-be-formed coil. (Only the pads 116A-116D, and not the entire metal interconnect structure, are shown for clarity.)

As further shown in FIGS. 1A-1D, metal interconnect structure 112 includes a pair of switch metal plugs 118A and 118B that sit on top of and extend through passivation layer 114 to make electrical connections with the switch pads 116A and 116B, respectively. In addition, metal interconnect structure 112 also includes a pair of coil metal plugs 118C and 118D that sit on top of and extend through passivation layer 114 to make electrical connections with the coil pads 116C and 116D, respectively. The metal plugs 118A-118D can be formed in a conventional copper electroplating process.

As additionally shown in FIGS. 1A-1D, the method begins by forming a non-conductive layer 120 that touches the top surface of passivation layer 114 and the side wall surfaces of the metal plugs 118A-118D, and a lower magnetic core section 122 that extends through non-conductive layer 120 to touch the top surface of passivation layer 114. Non-conductive layer 120 and lower magnetic core section 122 are formed so that the top surfaces of the metal plugs 118A-118D, non-conductive layer 120, and lower magnetic core section 122 lie substantially in the same plane P.

For example, as shown in FIGS. 2A-2D, non-conductive layer 120 can be formed by depositing a layer of photoimageable epoxy or polymer, such as SU-8, which is substantially self planarizing, on the top surface of passivation layer 114. Once the photoimageable epoxy or polymer has been deposited, a lower core opening 124 is formed by projecting a light through a mask to form a patterned image on the layer of photoimageable epoxy or polymer. The light hardens the regions of the layer of photoimageable epoxy or polymer that are exposed to light. Following this, the softened regions (the regions protected from light) of the layer of photoimageable epoxy or polymer are removed to form non-conductive layer 120 with lower core opening 124 that exposes the top surface of passivation layer 114.

As shown in FIGS. 3A-3D, once non-conductive layer 120 with lower core opening 124 has been formed, lower magnetic core section 122 is formed by depositing a seed layer 126 on passivation layer 114 and non-conductive layer 120. For example, seed layer 126 can be formed by depositing 300 Å of titanium, 3000 Å of copper, and 300 Å of titanium. (Seed layer 126 can also include a barrier layer to prevent copper electromigration if needed.)

After seed layer 126 has been formed, the top titanium layer is stripped and a soft magnetic material, such as an alloy of nickel and iron like permalloy or orthonol, is deposited by electroplating to a thickness of, for example, 10 μm to form a plated layer 130. After this, as shown in FIGS. 4A-4D, wafer 100 is planarized in a conventional manner, such as by chemical-mechanical polishing, to expose the top surfaces of the plugs 118A-118D and form lower magnetic core section 122.

As shown in FIGS. 5A-5D, after non-conductive layer 120 and lower magnetic core section 122 have been formed, a coil structure is next formed. The coil structure is formed by forming a non-conductive layer 134 on non-conductive layer 120 and lower magnetic core section 122. Non-conductive layer 134 has a number of plug openings 136A-136D that expose the plugs 118A-118D, respectively, and a pair of via openings 138A and 138B that expose regions on the top surface of lower magnetic core section 122.

For example, non-conductive layer 134 can be formed with a layer of photoimageable epoxy or polymer, such as SU-8, which is substantially self planarizing. Once the photoimageable epoxy or polymer has been deposited, the openings 136A-136D and 138A-138B are formed by projecting a light through a mask to form a patterned image on the photoimageable epoxy or polymer. The light hardens the regions of the photoimageable epoxy or polymer that are exposed to the light. Following this, the softened regions (the regions protected from light) of the photoimageable epoxy or polymer are removed to form non-conductive layer 134 with the openings 136A-136D and 138A-138B.

As shown in FIGS. 6A-6D, following the formation of non-conductive layer 134 with the openings 136A-136D and 138A-138B, a coil 140 which has a continuous series of loops is formed on non-conductive layer 134 so that a portion of each loop lies directly vertically over lower magnetic core section 122. Coil 140 is electrically connected to the coil plugs 118C and 118D. In addition, a pair of switch plugs 142A-142B is formed through non-conductive layer 134 to make electrical connections with the switch plugs 118A-118B, respectively.

For example, as shown in FIGS. 7A-7D, coil 140 and the switch plugs 142A-142B can be formed by forming a seed layer 144 on the plugs 118A-118D, lower magnetic core section 122, and non-conductive layer 134. Seed layer 144 can be formed by depositing 300 Å of titanium, 3000 Å of copper, and 300 Å of titanium. (Seed layer 144 can also include a barrier layer to prevent copper electromigration if needed.)

Once seed layer 144 has been formed, a plating mold 146 is formed on the top surface of seed layer 144. Plating mold 146, in turn, has an opening that exposes a portion of seed layer 144 that lies over the plugs 118C and 118D and defines the shape of the to-be-formed coil, and openings that expose portions of seed layer 144 that lie over the plugs 118A-118B.

As shown in FIGS. 8A-8D, following the formation of plating mold 146, the top titanium layer is stripped and copper is deposited by electroplating to form coil 140 and the switch plugs 142A-142B. After the electroplating, plating mold 146 and the underlying regions of seed layer 144 are removed.

After coil 140 and the switch plugs 142A-142B have been formed, as shown in FIGS. 9A-9D, a non-conductive layer 150 is deposited on non-conductive layer 134, coil 140, and the plugs 142A-142B to complete the formation of the coil structure. Non-conductive layer 150 has a pair of switch openings 152A and 152B that expose the top surfaces of the switch plugs 142A and 142B, and a pair of core openings 152C and 152D that expose regions on the top surface of lower magnetic core section 122.

For example, non-conductive layer 150 can be formed with a layer of photoimageable epoxy or polymer, such as SU-8, which is substantially self planarizing. Once the photoimageable epoxy or polymer has been deposited, the openings 152A-152D are formed by projecting a light through a mask to form a patterned image on the photoimageable epoxy or polymer. The light hardens the regions of the photoimageable epoxy or polymer that are exposed to the light. Following this, the softened regions (the regions protected from light) of the photoimageable epoxy or polymer are removed to forming non-conductive layer 150 with the openings 152A-152D.

As shown in FIGS. 10A-10D, once non-conductive layer 150 with the openings 152A-152D have been formed, a magnetic core via 154A and a magnetic core via 154B are formed in the openings 152C and 152D, respectively, to touch the opposite ends of lower magnetic core section 122. For example, as shown in FIGS. 11A-11D, the magnetic core vias 154A and 154B can be formed by depositing a seed layer 160 on the top surfaces of lower magnetic core section 122, the switch plugs 142A-142B, and non-conductive layer 150.

Seed layer 160 can be formed by depositing 300 Å of titanium, 3000 Å of copper, and 300 Å of titanium. (Seed layer 160 can also include a barrier layer to prevent copper electromigration if needed.) After seed layer 160 has been formed, a plating mold 162 is formed on the top surface of seed layer 160. Plating mold 162, in turn, has openings that expose portions of seed layer 160 that lie over the ends of lower magnetic core section 122.

As shown in FIGS. 12A-12D, following the formation of plating mold 162, the top titanium layer is stripped and a soft magnetic material, such as an alloy of nickel and iron like permalloy or orthonol, is deposited by electroplating to a thickness of, for example, 4 μm to form plated regions 164A and 164B. After the electroplating, plating mold 162 and the underlying regions of seed layer 164 are removed. Following this, wafer 100 is planarized to remove portions of plated regions 164A and 164B and form the magnetic core vias 154A and 154B. As a result, the continuous series of loops of coil 140 is wound around magnetic core via 154B.

After the magnetic core vias 154A-154B have been formed, as shown in FIGS. 13A-13D, an upper structure is next formed. The upper structure can be formed by forming a non-conductive member 170 on non-conductive layer 150 and magnetic core via 154A to cover core magnetic via 154A. For example, as shown in FIGS. 14A-14D, non-conductive member 170 can be formed by depositing a non-conductive layer 172 on the plugs 142A-142B, non-conductive layer 150, and the magnetic core vias 154A and 154B. After this, a patterned photoresist layer 174 is formed on the top surface of non-conductive layer 172.

Patterned photoresist layer 174 is formed in a conventional manner, which includes depositing a layer of photoresist, and projecting a light through a patterned black/clear glass plate known as a mask to form a patterned image on the layer of photoresist. The light softens the photoresist regions exposed to the light. Following this, the softened photoresist regions are removed. After patterned photoresist layer 174 has been formed, the exposed regions of non-conductive layer 172 are etched in a conventional manner to form non-conductive member 170. Patterned photoresist layer 174 is then removed with conventional solvents and processes.

As shown in FIGS. 15A-15D, following the formation of non-conductive member 170, a metal plug 180 and a metal trace 182 are formed to make electrical connections to switch plugs 142A and 142B, respectively. For example, as shown in FIGS. 16A-16D, metal plug 180 and metal trace 182 can be formed by depositing a gold layer 184 approximately 3000 Å thick that touches the switch plugs 142A-142B, non-conductive layer 150, core via 154B, and non-conductive member 170.

After this, a patterned photoresist layer 186 is formed on the top surface of gold layer 184. Patterned photoresist layer 186 is formed in a conventional manner. After patterned photoresist layer 186 has been formed, the exposed regions of gold layer 184 are etched in a conventional manner to form metal plug 180 and metal trace 182. Patterned photoresist layer 186 is then removed with conventional solvents and processes.

As shown in FIGS. 17A-17D, following the formation of metal plug 180 and metal trace 182, a sacrificial structure 190 is formed to touch the top surface of non-conductive layer 150, magnetic core via 154B, non-conductive member 170, and metal trace 182. For example, as shown in FIGS. 18A-18D, sacrificial structure 190 can be fabricated by forming a sacrificial layer 192 on non-conductive layer 150, magnetic core via 154B, non-conductive member 170, metal plug 180, and metal trace 182.

After this, a patterned photoresist layer 194 is formed on the top surface of sacrificial layer 192. Patterned photoresist layer 194 is formed in a conventional manner. After patterned photoresist layer 194 has been formed, the exposed regions of sacrificial layer 192 are etched in a conventional manner to form sacrificial structure 190. Patterned photoresist layer 194 is then removed with conventional solvents and processes.

As shown in FIGS. 19A-19D, following the formation of sacrificial structure 190, a metal trace 210 is formed to touch the top surface of non-conductive member 170, metal plug 180, and sacrificial structure 190 to lie over lower magnetic core section 122 and a contact region of metal trace 182. After the formation of metal trace 210, a magnetic cantilever core section 212 is formed to touch the top surface of metal trace 210 and lie over lower magnetic core section 122.

For example, as shown in FIGS. 20A-20D, metal trace 210 and magnetic cantilever core section 212 can be formed by depositing a gold layer 220 approximately 3000 Å thick on the top surfaces of non-conductive layer 150, non-conductive member 170, metal plug 180, metal trace 182, and sacrificial structure 190 to lie over lower magnetic core section 122. After gold layer 220 has been formed, a plating mold 222 is formed on the top surface of gold layer 220. Plating mold 222, in turn, has an opening that exposes a portion of gold layer 220 that defines the shape of the to-be-formed magnetic cantilever core section 212.

As shown in FIGS. 21A-21D, following the formation of plating mold 222, a soft magnetic material, such as an alloy of nickel and iron like permalloy or orthonol, is deposited by electroplating to a thickness of, for example, 2 μm to form magnetic cantilever core section 212. After the electroplating, plating mold 222 and the underlying regions of gold layer 220 are removed to form metal trace 210. Thus, gold layer 220 is used to form metal trace 210 as well as a seed layer for electroplating the soft magnetic material.

After this, as shown in FIGS. 22A-22D, sacrificial structure 190 is etched away to form a MEMS relay 230. As a result, sacrificial structure 190 can be implemented with any material which can selectively etched away without removing excessive amounts of the exposed elements of MEMS relay 230. Thus, as further shown in FIGS. 22A-22D, MEMS relay 230 includes a switch 232, which has a contact region 234 at the end of metal trace 182, and a contact region 236 at the end of metal trace 210 that opposes contact region 234.

In operation, contact region 236 is movable between a first position and a second position. Switch 232 is open when no current flows through coil 140. In this condition, contact region 234 is in the first position, which is vertically spaced apart from contact region 236 by a gap 240. FIG. 22A-22D show MEMS relay 230 in the open position. FIG. 23 shows a cross-sectional view taken along line 22B-22B of FIG. 22A that illustrates MEMS relay 230 in the closed position in accordance with the present invention.

As shown in FIG. 23, switch 232 closes when a current flows through coil 140. The current generates a magnetic field that pulls magnetic cantilever core section 212 towards magnetic core via 154B and lower magnetic core section 122 which, in turn, causes contact region 236 to move to the second position and touch contact region 234.

One of the advantages of MEMS relay 230 is that MEMS relay 230 only requires a small vertical movement to close gap 240 between the contacts 234 and 236 and therefore is mechanically robust. In addition, MEMS relay 230 has a small footprint and, therefore, can be formed on top of small integrated circuits.

In order for switch 232 to close when current flows through coil 140, the electromagnetic force generated by coil 140 must be greater than the spring force of magnetic cantilever core section 212 (the force required to deflect contact region 236 of magnetic cantilever core section 212 the amount required to close gap 240) combined with a contact force (the force required to ensure that contact region 236 fully touches contact region 234).

The spring force of magnetic cantilever core section 212, in turn, is a function of the thickness of magnetic cantilever core section 212. In the present example, the thickness of magnetic cantilever core section 212 is much thinner (two microns) than the thickness of lower magnetic core section 122 (ten microns). As a result, the cross-sectional area of magnetic cantilever core section 212 (thickness of two microns times a width) is much less than the cross-sectional area of lower magnetic core section 122 (thickness of ten microns times the same width).

The maximum amount of magnetic flux that can flow through a core member is a function of the cross-sectional area of the core member and the permeability of the core member. Thus, if lower magnetic core section 122, the magnetic core vias 154A and 154B, and magnetic cantilever core section 212 are formed from the same material, substantially more magnetic flux flows through lower magnetic core section 122 than flows through the magnetic core vias 154A and 154B and magnetic cantilever core section 212. (The magnetic core vias 154A and 154B and magnetic cantilever core section 212 can be formed to have the same cross-sectional areas.)

To increase the amount of magnetic flux that flows through magnetic cantilever core section 212, and thus better contain the magnetic flux around magnetic cantilever core section 212, lower magnetic core section 122 can be formed from a material that has a different permeability than the material used to form the magnetic core vias 154A and 154B and magnetic cantilever core section 212.

For example, magnetic cantilever core section 212 and the magnetic core vias 154A and 154B can be formed from permalloy, which has a high permeability. Permalloy is approximately 80% nickel and 20% iron. Adjusting the relative percentages of the materials lowers the permeability. For example, orthonol is a nickel-iron alloy of 50% nickel and 50% iron that has a lower permeability than permalloy.

Thus, the differences between the cross-sectional areas of lower magnetic core section 122 and magnetic cantilever core section 212, which effect the maximum amount of flux that can pass through sections 122 and 212, can be compensated for by forming lower magnetic core section 122 with a material that has a lower permeability than the material used to form the magnetic core vias 154A and 154B and magnetic cantilever core section 212.

Alternately, the amount of magnetic flux that flows through magnetic cantilever core section 212 can be increased by increasing the widths of the magnetic core vias 154A and 154B and magnetic cantilever core section 212. Increasing the widths increases the cross-sectional areas of the magnetic core vias 154A and 154B and magnetic cantilever core section 212.

Figure 22A:
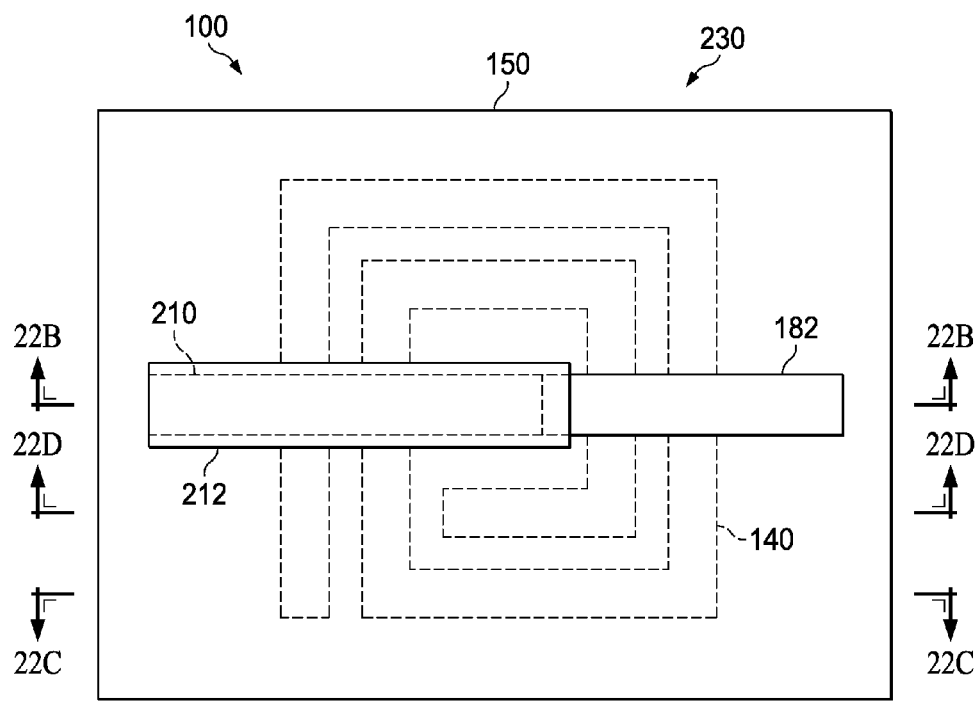
Figure 22B:
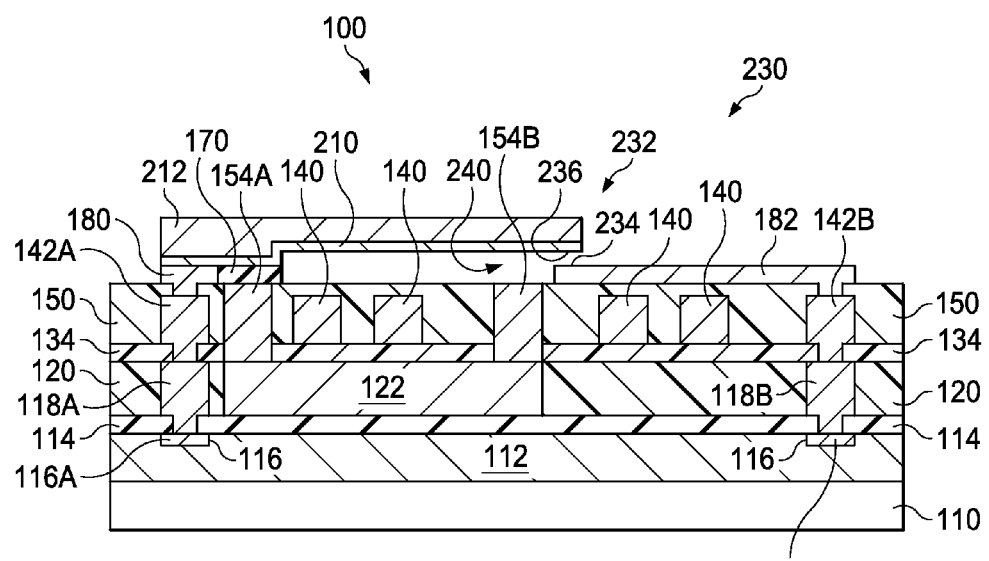
Figure 22C:
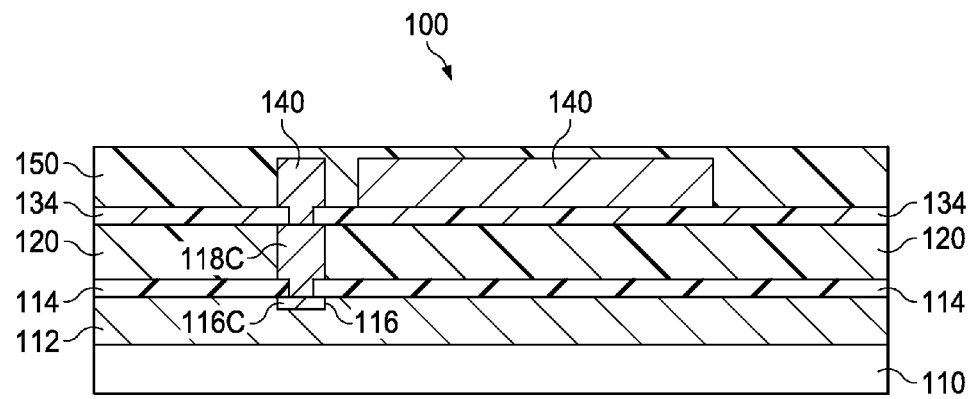
Figure 22D:
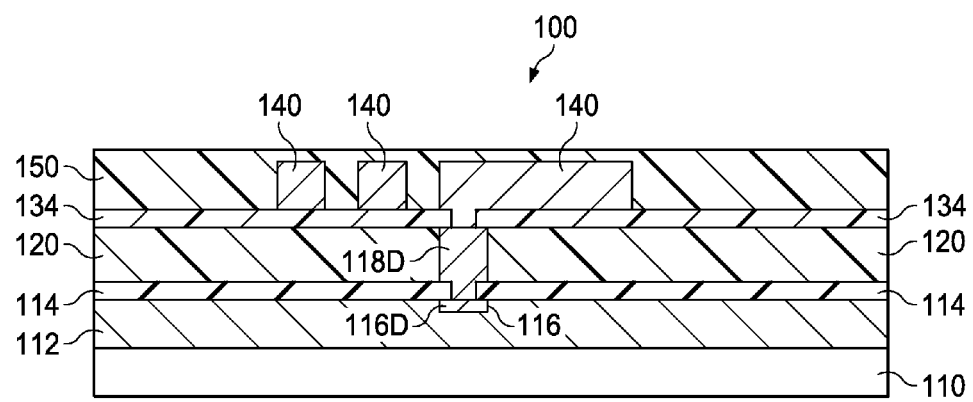
Figure 23:
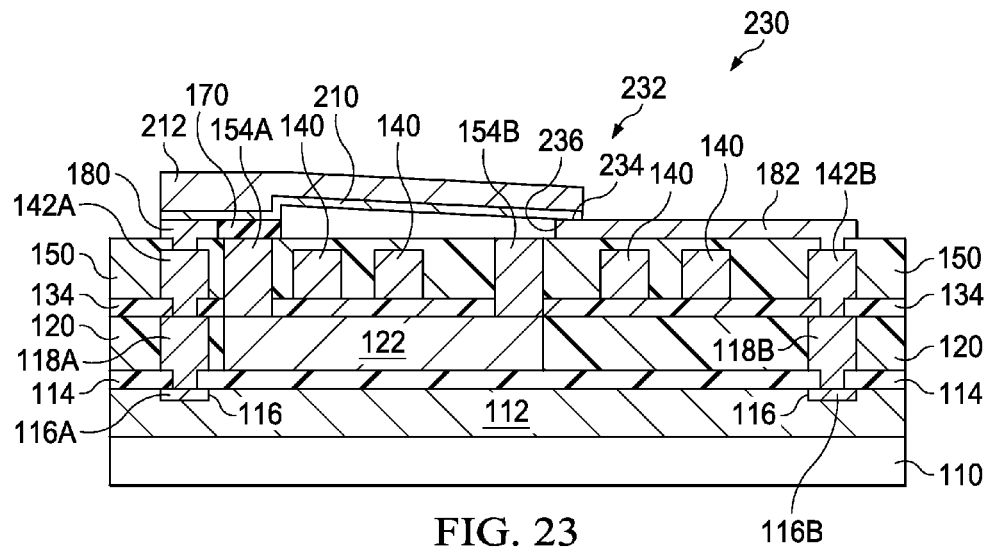
FIG. 23 is a cross-sectional view taken along line 22B-22B of FIG. 22A illustrating MEMS relay 230 in the closed position in accordance with the present invention.
Figure 24:
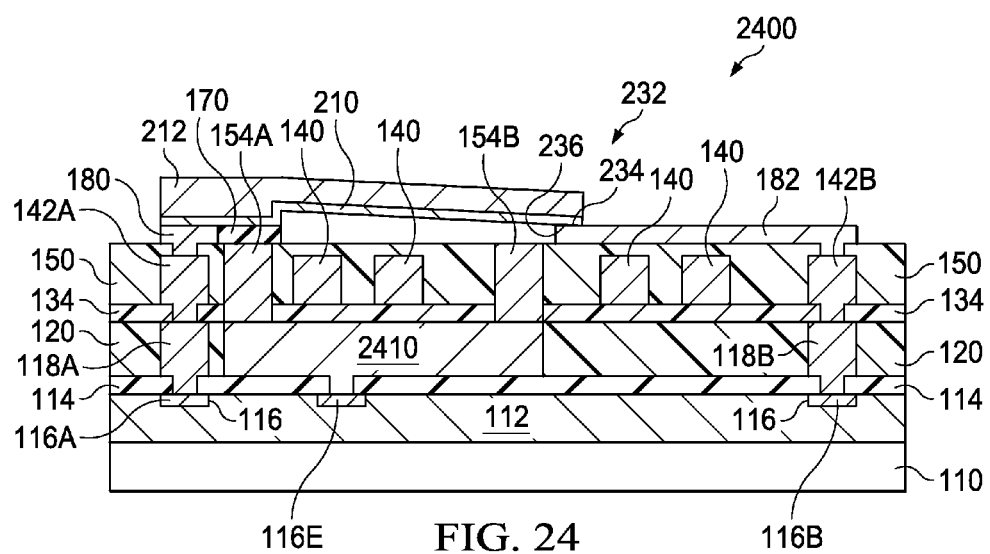
FIG. 24 is a cross-sectional view taken along line 22B-22B of FIG. 22A illustrating an example of a MEMS relay 2400 in accordance with an alternate embodiment of the present invention.

FIG. 24 shows a cross-sectional view taken along line 22B-22B of FIG. 22A that illustrates an example of a MEMS relay 2400 in accordance with an alternate embodiment of the present invention. MEMS relay 2400 is similar to MEMS relay 230 and, as a result, utilizes the same reference numerals to designate the structures which are common to both relays.

As shown in FIG. 24, MEMS relay 2400 differs from MEMS relay 230 in that MEMS relay 2400 utilizes a lower magnetic core section 2410 in lieu of lower magnetic core section 122. Lower magnetic core section 2410 is the same as lower magnetic core section 122 except that lower magnetic core section 2410 also extends through passivation layer 114 to make an electrical connection with a pad 116E, which allows a voltage to be placed on lower magnetic core section 2410 and the magnetic core vias 154A and 154B.

In operation, after switch 232 has closed in response to current flowing through coil 140, a holding voltage with a magnitude that is sufficient to electrostaticly hold switch 232 in the closed position is placed on lower magnetic core section 2410 and the magnetic core vias 154A and 154B by way of pad 116E. (The voltage required to electrostaticly hold switch 232 closed is substantially less than the voltage required to electrostaticly close switch 232.)

After the holding voltage has been applied, the current fed into coil 140 is stopped, utilizing the holding voltage to keep switch 232 closed. One of the advantages of the present embodiment is that no current is required, and thus no power is consumed, to maintain switch 232 in the closed position. (The holding voltage can also be applied to lower magnetic core section 2410 before current is fed into coil 140 to close switch 232.)

For example, if switch 232 is a ground switch such that ground is placed on the metal traces 182 and 210 when switch 232 is closed, then a positive holding voltage can placed on lower magnetic core section 2410 and the magnetic core vias 154A and 154B by way of pad 116E after switch 232 has been closed. (If the positive holding voltage is less than a power supply voltage, the power supply voltage can be placed on lower magnetic core section 2410 and the magnetic core vias 154A and 154B by way of pad 116E after switch 232 has been closed.) The current fed into coil 140 is then stopped, utilizing the holding voltage to keep switch 232 closed.

Similarly, if switch 232 is a power switch such that a power supply voltage is placed on the metal traces 182 and 210 when switch 232 is closed, then a voltage equal to the power supply voltage less the holding voltage can be placed on lower magnetic core section 2410 and the magnetic core vias 154A and 154B by way of pad 116E after switch 232 has been closed. (If the holding voltage is less than the power supply voltage, ground can be placed on lower magnetic core section 2410 and the magnetic core vias 154A and 154B by way of pad 116E after switch 232 has been closed.) The current fed into coil 140 is then stopped, utilizing the holding voltage to keep switch 232 closed.

If switch 232 is a signal switch such that the voltage placed on the metal traces 182 and 210 varies between ground and the power supply voltage when switch 232 is closed, then a voltage equal to the power supply voltage plus the holding voltage can be placed on lower magnetic core section 2410 and the magnetic core vias 154A and 154B by way of pad 116E after switch 232 has been closed. (Alternately, a voltage equal to ground less the holding voltage can be placed on lower magnetic core section 2410 and the magnetic core vias 154A and 154B by way of pad 116E after switch 232 has been closed.) The current fed into coil 140 is then stopped, utilizing the holding voltage to keep switch 232 closed.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A method of forming a MEMS relay comprising:
   providing a semiconductor structure having a top surface;
   forming a metal interconnect structure touching the semiconductor structure top surface;
   depositing a top passivation layer, having top and bottom surfaces, performing a mask and etch process to form openings in the top passivation layer to expose a plurality of conductive pads, wherein the plurality of conductive pads provide points for external electrical connections, and points for electrical connections to overlying devices, wherein a first pad of the plurality of conductive pads is coupled to a first switch contact and a magnetic cantilever, a second pad of the plurality of conductive pads is coupled to a second switch contact, a third pad of the plurality of conductive pads is coupled lower magnetic core section and a first pair of pads are coupled to a magnetic coil;
   depositing a photoimageable epoxy or polymer forming a first non-conductive layer, having top and bottom surfaces, that touches the top surface of the passivation layer having a second set of openings for switch metal plugs, magnetic coil metal plugs and a lower magnetic core section, formed by a mask and develop process;
   forming the lower magnetic core section, having top and bottom surfaces, that extends through the first non-conductive layer, touching the top surface of the top passivation layer and communicating with the third pad of the plurality of conductive pads, by depositing a seed layer and then plating the seed layer with a soft magnetic material, wherein the top surface of the lower magnetic core section and the top surface of the first non-conductive layer lie substantially in the same plane;

forming a first plurality of metal plugs, having top and bottom surfaces, formed in the second set of openings of the first non-conductive layer for coupling with a switch and a magnetic coil, wherein the top surfaces of the first plurality of metal plugs and the top surface of the first non-conductive layer lie substantially in the same plane;

depositing a second non-conductive layer, having top and bottom surfaces, that touches the top surface of the first non-conductive layer and the top surface of the lower magnetic core section with a third set of openings for switch metal plugs and magnetic coil metal plugs and via openings that expose regions on the top surface of the lower magnetic core section formed by a mask and etch process;

forming a coil of a continuous series of loops, having top and bottom surfaces, touching the top surface of the second non-conductive layer and the top surfaces of the magnetic switch metal plugs of the first plurality of metal plugs;

forming a second plurality of metal plugs, having top and bottom surfaces, formed on and in contact within the second set of openings of the second non-conductive layer for coupling with the switch contact;

depositing a photoimageable epoxy or polymer forming a third non-conductive layer, having top and bottom surfaces, that touches the top surface of the second non-conductive layer, the top surface of the lower magnetic core section and covering the coil having a fourth set of openings to expose the tops of the set of switch metal plugs of the second plurality of metal plugs and a pair of core openings to expose regions on the top surface of the lower magnetic core section formed by a mask and develop process;

forming first and second magnetic core vias, having top and bottom surfaces, formed in the pair of core openings, by depositing a seed layer and then plating the seed layer with the soft magnetic material, the bottom surfaces of the first and second magnetic core vias touching the top surface of the lower magnetic core section, wherein the tops surfaces of the first and second of magnetic core vias and the top surface of the third non-conductive layer lie substantially in the same plane;

depositing a fourth non-conductive member, having a top and bottom surfaces, touches the top surface of the first magnetic core via;

forming a first metal trace, having a top and bottom surfaces, touching the top surface of third non-conductive layer the top of the first metal switch plug of the second plurality of metal plugs by a mask and etch process;

forming a second metal trace, having a top and bottom surfaces, touching the top surface of third non-conductive layer and the top of the second metal switch plug of the second plurality of metal plugs by a mask and etch process;

forming a third metal trace, having a top and bottom surfaces, touching the top surface of the fourth non-conductive member and the first metal trace;

wherein the second and third metal traces have first and second metal contact regions respectively, disposed at the ends and top surface of the second metal trace the bottom surface of the third metal trace, forming the switch contacts;

forming a magnetic cantilever core section that touches the top surface of the third metal trace;

wherein the second contact region is spaced apart from the first contact region when the second contact region is in the first position, the second contact region touching the first contact region when the second contact region is in the second position; and wherein the lower magnetic core section and the third conductive trace are electrically coupled to a holding voltage source to electrostaticaly maintain a closed position after the coil is deenergized.

2. The method of claim 1 wherein the seed layer is comprised of a first layer of titanium; a second layer of titanium and a layer of copper therebetween, the first layer of titanium forming the bottom of the seed layer and the second layer of titanium forming the top of the seed layer.

3. The method of claim 1 wherein the soft magnetic material is comprised of an alloy of nickel and iron.

4. The method of claim 1 wherein forming a coil of a continuous series of loops and the second plurality of metal plugs includes:

depositing the seed layer touching the top surface of the second non-conductive layer and the top surfaces of the magnetic switch coil metal plugs of the first plurality of metal plugs;

forming a sacrificial coil and second plurality of metal plugs mold;

etching an removing the second layer of titanium down to the copper of the seed layer exposed by the sacrificial coil and second plurality of metal plugs mold;

plating the coil metal and the second plurality of metal plugs on the seed layer; and removing the sacrificial mold and the remaining seed layer.

5. The method of claim 1 wherein the first, second and third metal traces are comprised of gold.

6. The method of claim 1 wherein the coil metal and the second plurality of metal plugs are comprised of copper.

7. The method of claim 1 wherein forming third metal trace and the magnetic cantilever core section structure includes:

forming a sacrificial structure to touch a top surface of the third non-conductive layer and the second metal trace, the third metal trace touching and lying over the non-conductive member and the first metal trace and the sacrificial structure; and forming an upper magnetic core section that touches the second metal trace.

8. The method of claim 7 and further comprising removing the sacrificial structure after the upper magnetic core section has been formed.

* * * * *